(12) United States Patent  
Nagai

(10) Patent No.: US 8,237,178 B2  
(45) Date of Patent: Aug. 7, 2012

(54) LIGHT-EMITTING DEVICE

(75) Inventor: Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/158,948

(22) Filed: Jun. 13, 2011

(65) Prior Publication Data

US 2011/0241033 A1 Oct. 6, 2011

Related U.S. Application Data

(62) Division of application No. 12/515,372, filed as application No. PCT/JP2008/002071 on Aug. 1, 2008, now Pat. No. 8,008,673.

(30) Foreign Application Priority Data

Aug. 3, 2007 (JP) ................................ 2007-203478  
Aug. 9, 2007 (JP) ................................ 2007-208216

(51) Int. Cl.  
*H01L 33/00* (2010.01)

(52) U.S. Cl. ................ 257/88; 257/86; 257/89

(58) Field of Classification Search .............. 257/86, 257/88, 89, 98  
See application file for complete search history.

(56) References Cited

U.S. PATENT DOCUMENTS

| 5,959,316 | A | 9/1999 | Lowery |
| 6,468,821 | B2 | 10/2002 | Maeda et al. |
| 6,791,259 | B1 | 9/2004 | Stokes et al. |
| 7,503,676 | B2 * | 3/2009 | Sakumoto ............... 362/293 |
| 7,812,360 | B2 * | 10/2010 | Yano .......................... 257/98 |
| 8,109,651 | B2 * | 2/2012 | Chen ...................... 362/249.02 |
| 2002/0084745 | A1 | 7/2002 | Wang et al. |
| 2003/0214233 | A1 | 11/2003 | Takahashi et al. |
| 2006/0006408 | A1 | 1/2006 | Suehiro et al. |
| 2006/0131594 | A1 | 6/2006 | Yano et al. |
| 2006/0220046 | A1 | 10/2006 | Yu et al. |
| 2007/0158669 | A1 | 7/2007 | Lee et al. |
| 2008/0205078 | A1 | 8/2008 | Karlicek et al. |
| 2010/0176751 | A1 | 7/2010 | Oshio et al. |
| 2010/0308356 | A1 | 12/2010 | Wirth |

FOREIGN PATENT DOCUMENTS

| EP | 1 737 050 | 12/2006 |
| JP | 7-99345 | 4/1995 |
| JP | 3065263 | 5/2000 |
| JP | 2005-166733 | 6/2005 |
| WO | 01/97287 | 12/2001 |
| WO | 2005/091388 | 9/2005 |

\* cited by examiner

*Primary Examiner* — Phuc Dang  
(74) *Attorney, Agent, or Firm* — Hamre, Schumann, Mueller & Larson, P.C.

(57) ABSTRACT

A light-emitting device includes a base and a light-emitting element that is disposed on the base. The light-emitting element is made up of a plurality of semiconductor layers including a light-emitting layer, and at the same time, is covered with a wavelength converting portion that includes a wavelength converting material. The light-emitting layer emits primary light, and the wavelength converting material absorbs part of the primary light and emits secondary light. The luminance of the primary light emitted from the edge portion of the light extraction surface of the light-emitting device is higher than the luminance of the primary light emitted from the inner region located inside the edge portion, and the ratio of the primary light and the secondary light that are emitted from a light extraction surface of the wavelength converting portion is substantially uniform across the light extraction surface of the wavelength converting portion. Thereby, a light color difference across the light extraction surface of the wavelength converting portion that covers the light-emitting element can be reduced further, and it is possible to irradiate an irradiation surface with light of uniform color.

2 Claims, 24 Drawing Sheets

[Fig. 1]
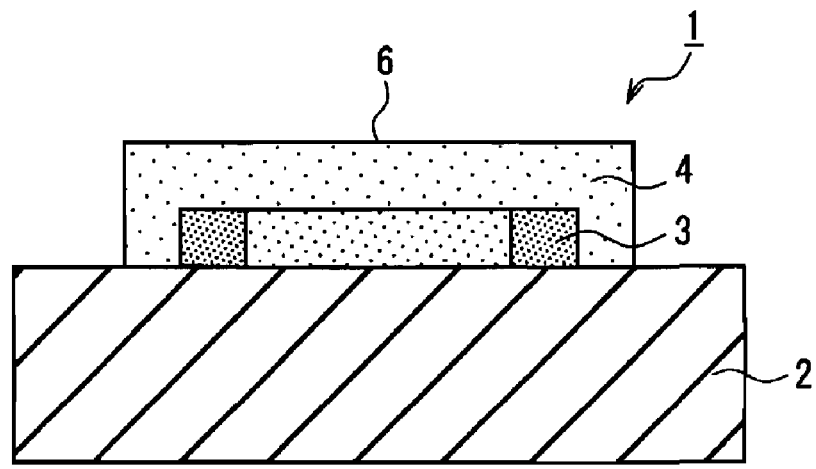
[Fig. 2]
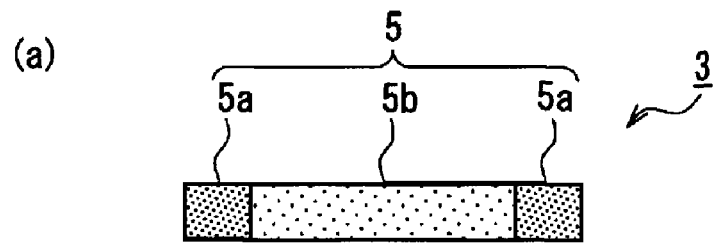
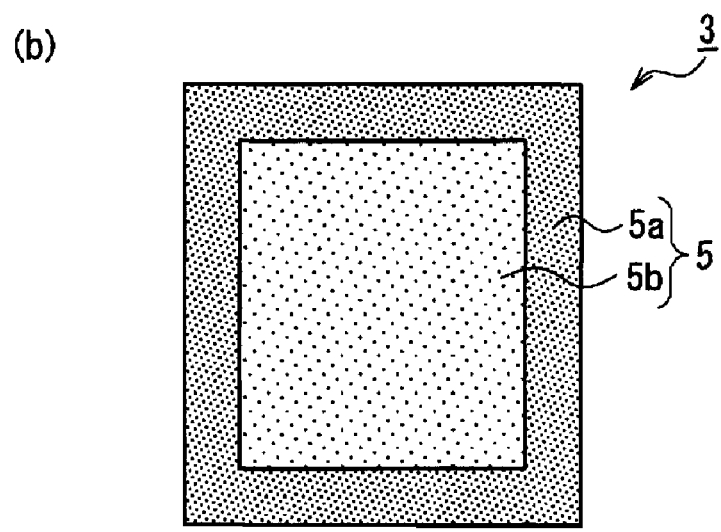

[Fig. 3]
(a)
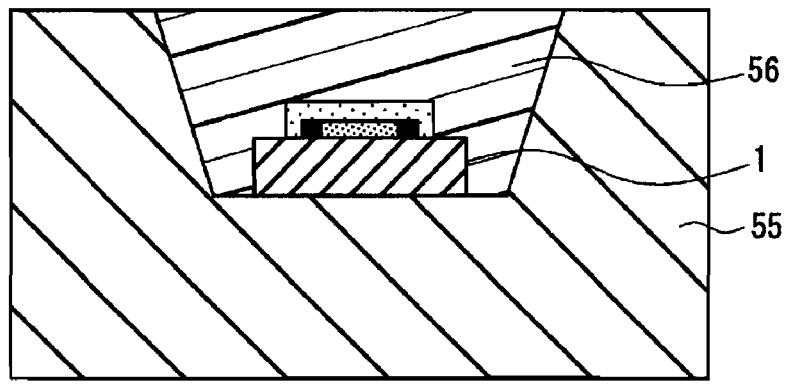
(b)
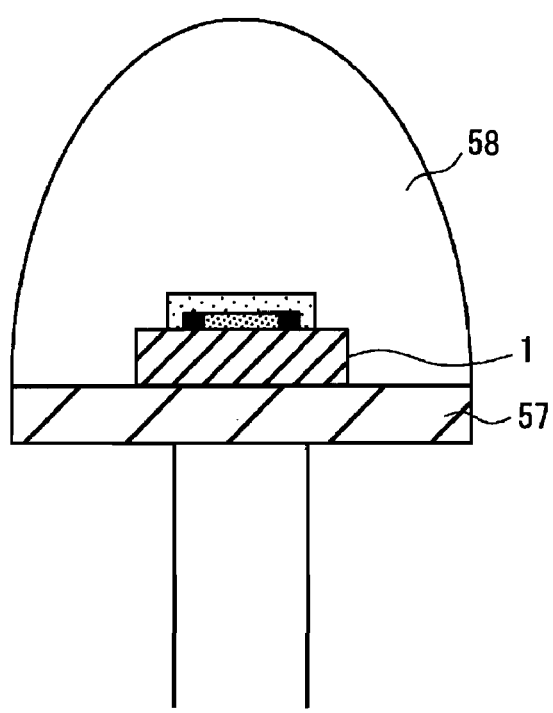
(c)
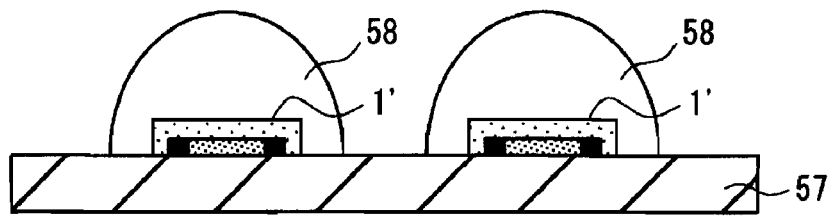

[Fig. 4]
(a)
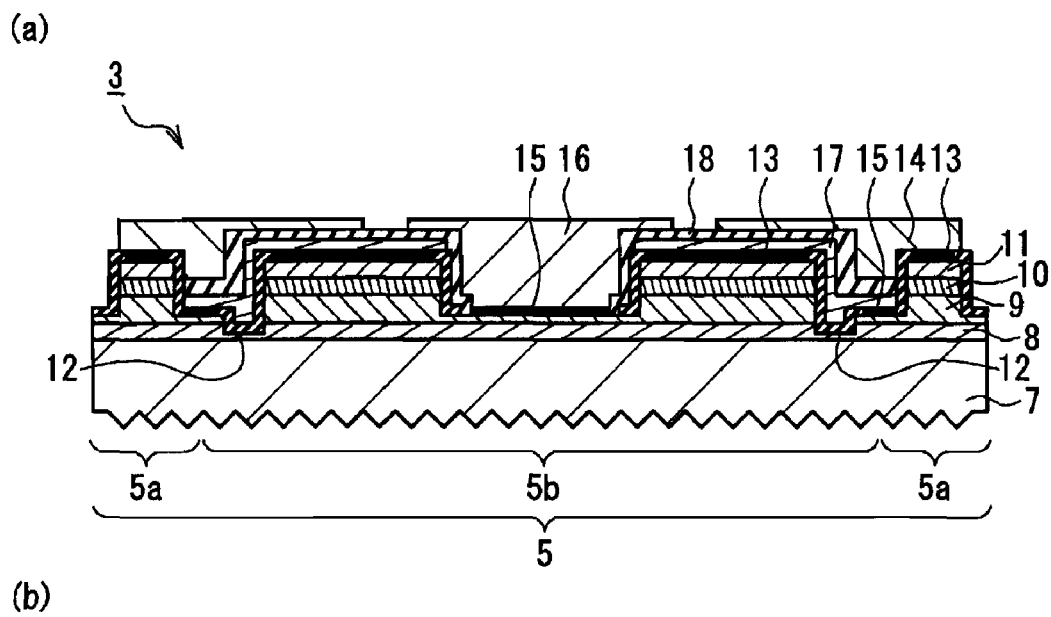
(b)
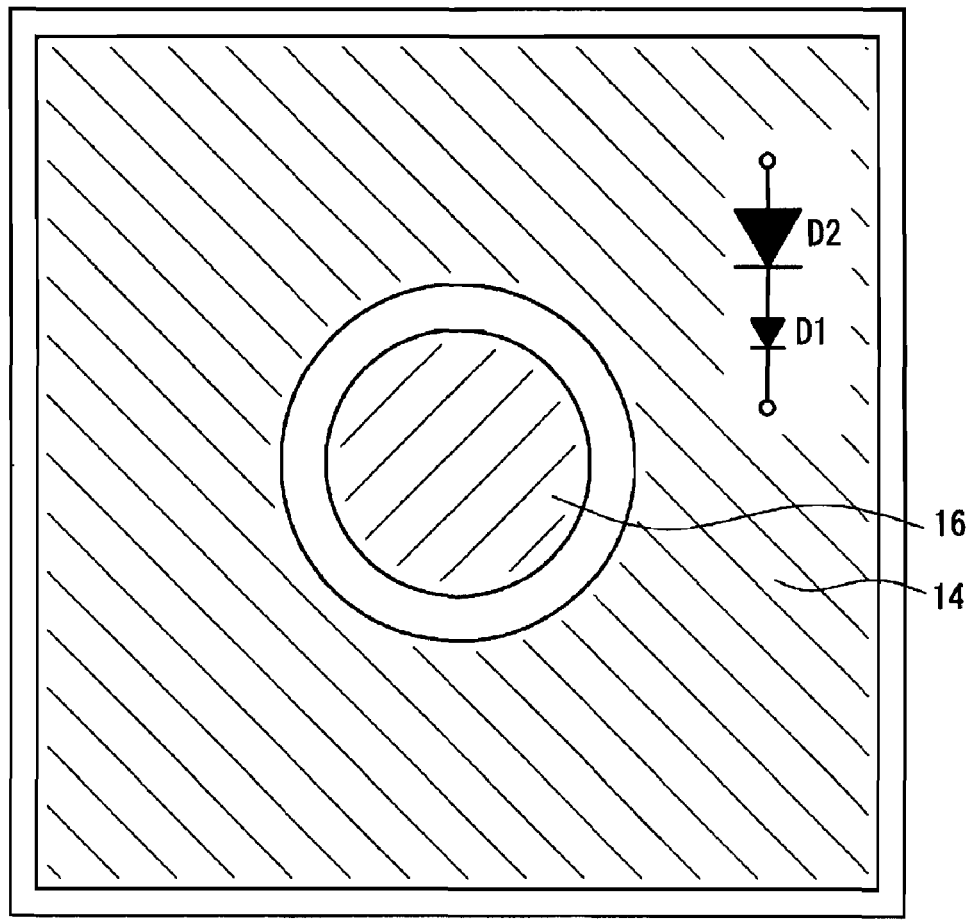

[Fig. 5]
(a)
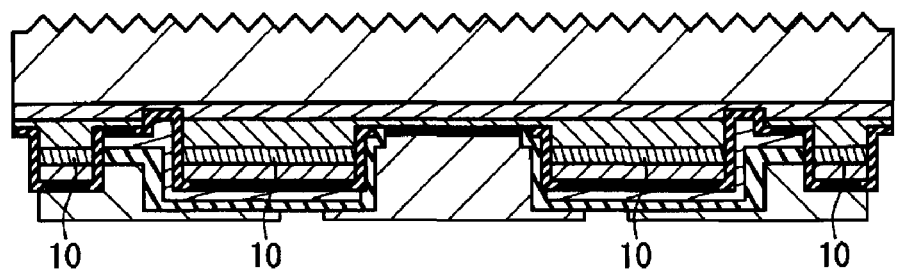
(b) About 0.15 mm
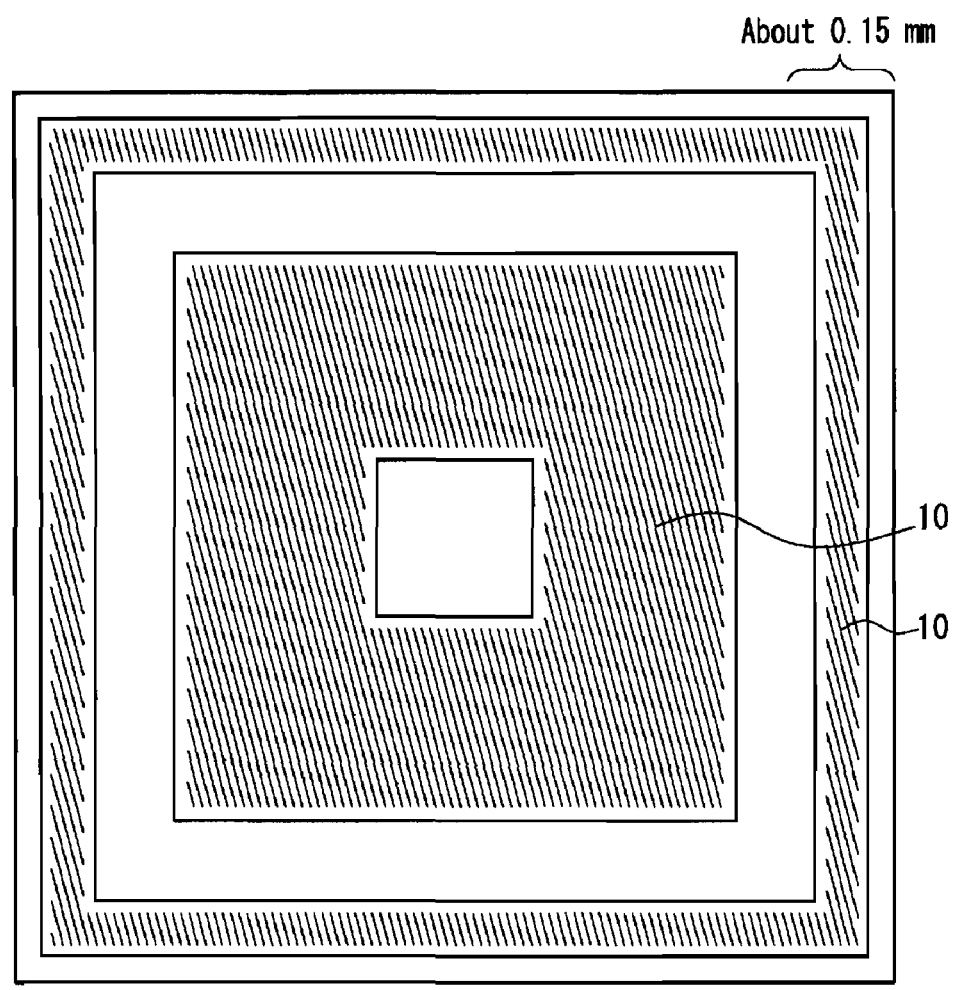

[Fig. 6]
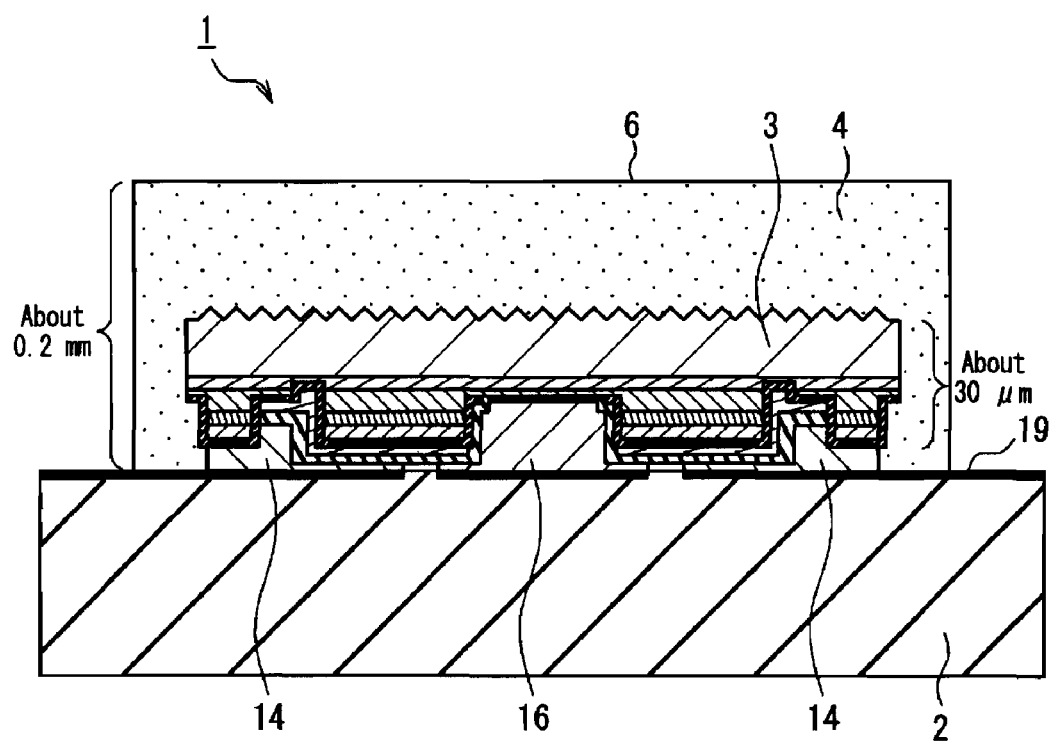

[Fig. 7]
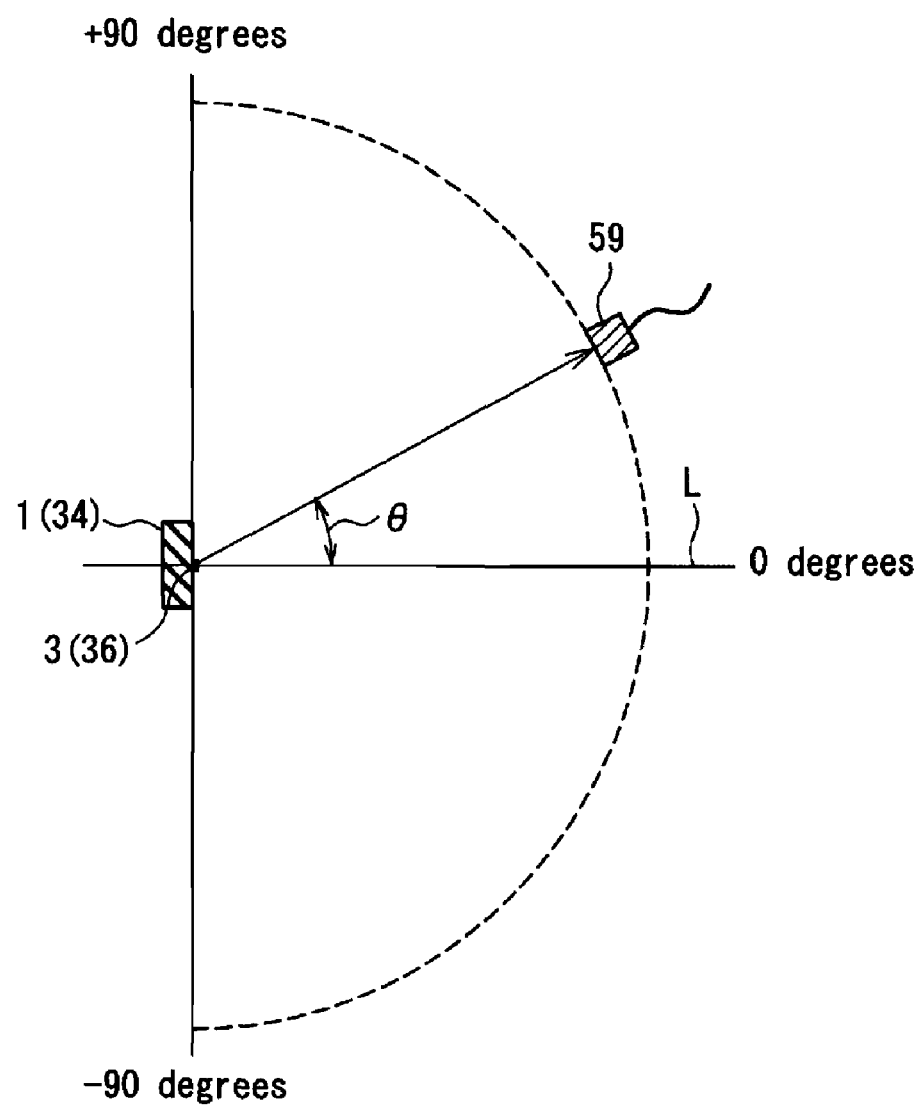

[Fig. 8]
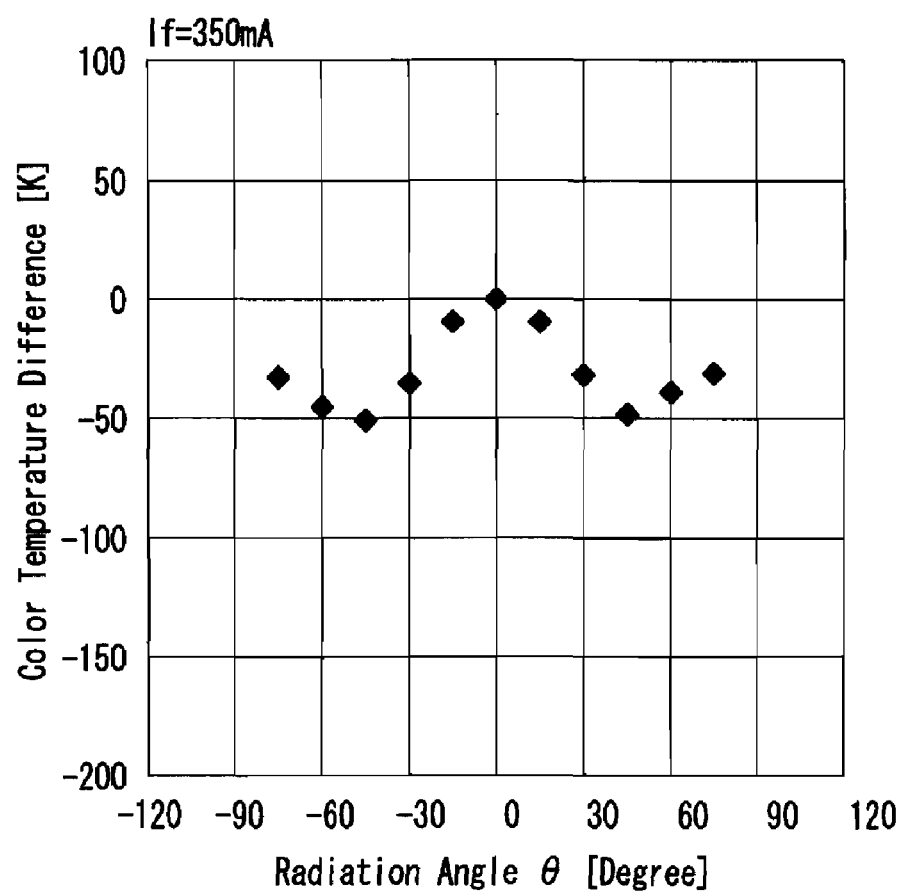

[Fig. 9]
(a)
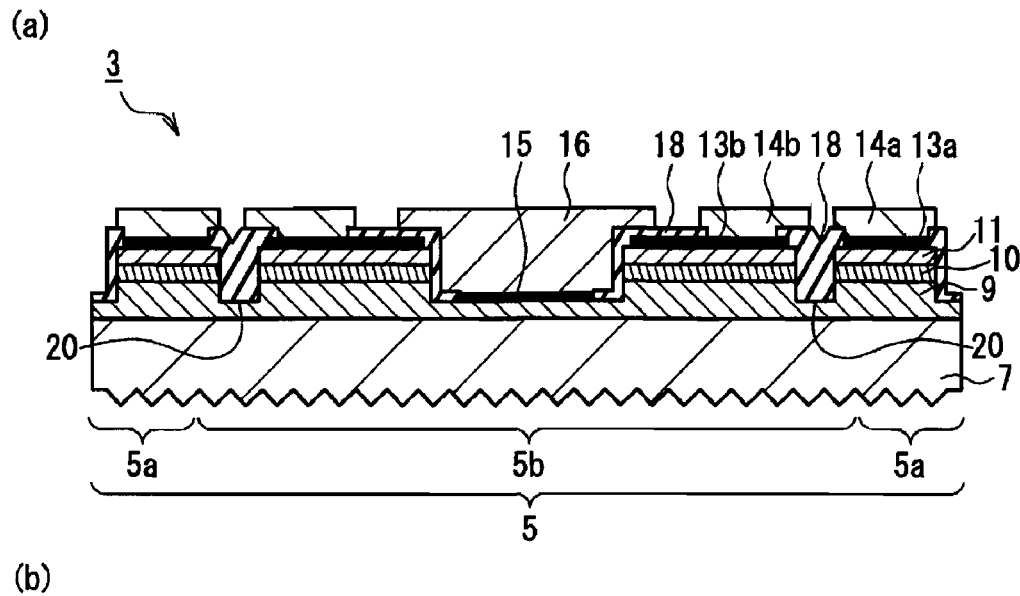
(b)
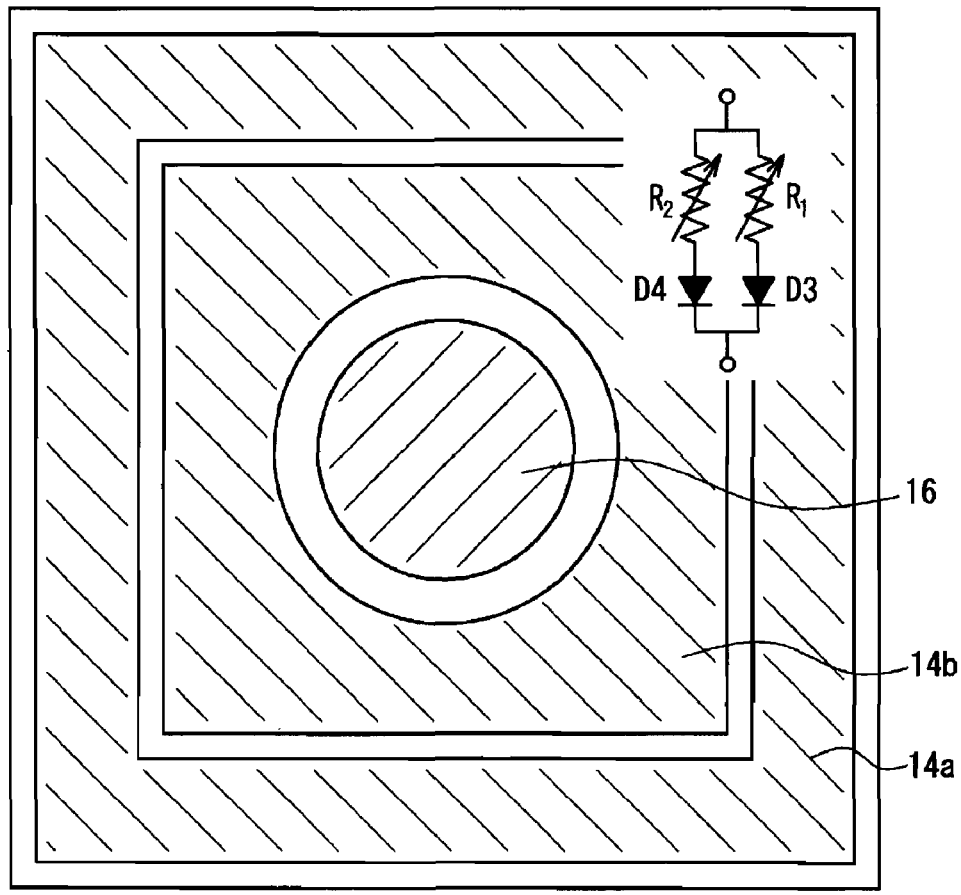

[Fig. 10]
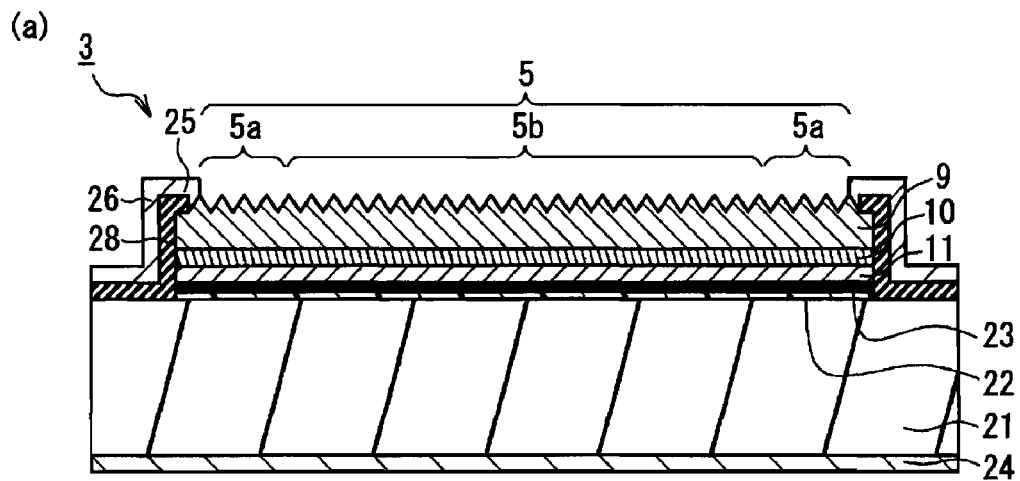
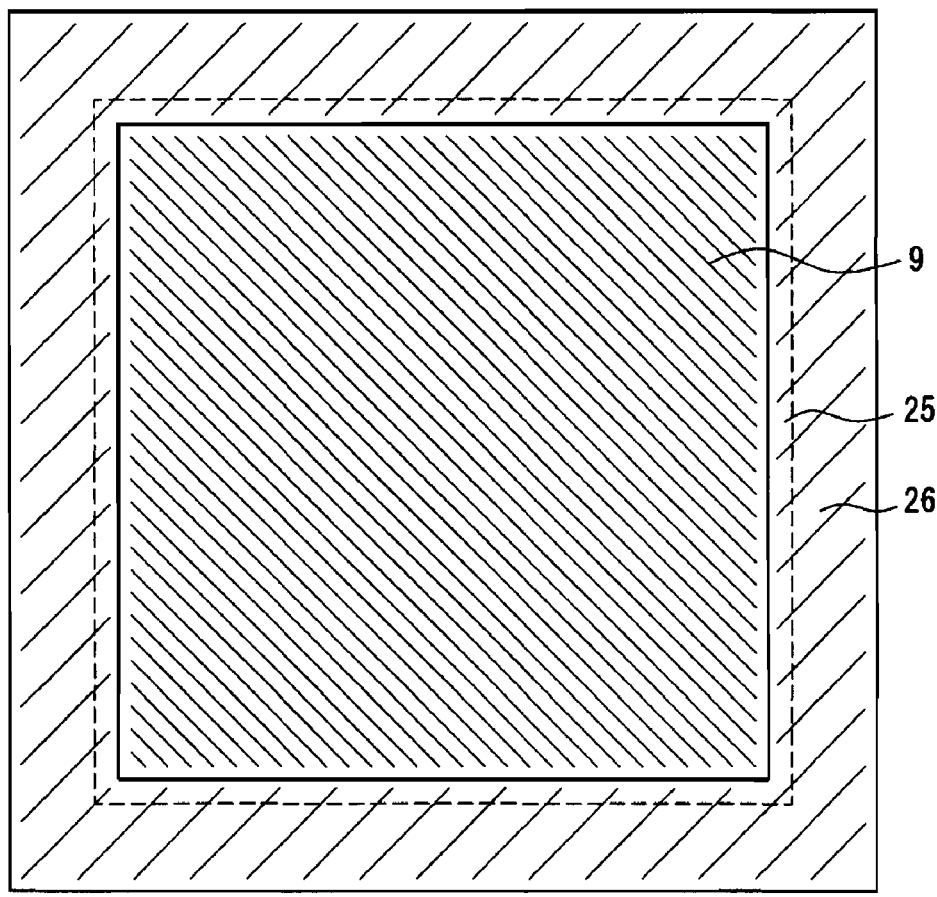

[Fig. 11]
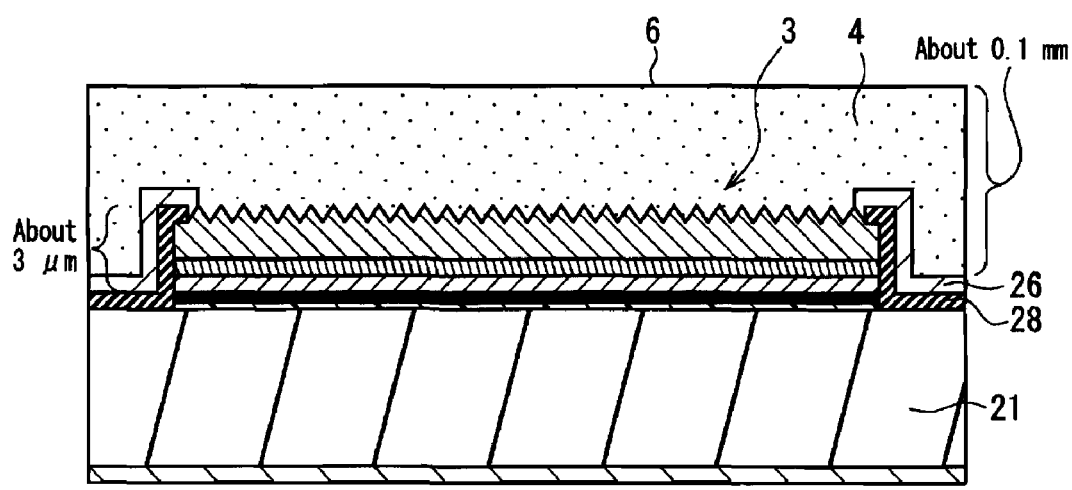

[Fig. 12]
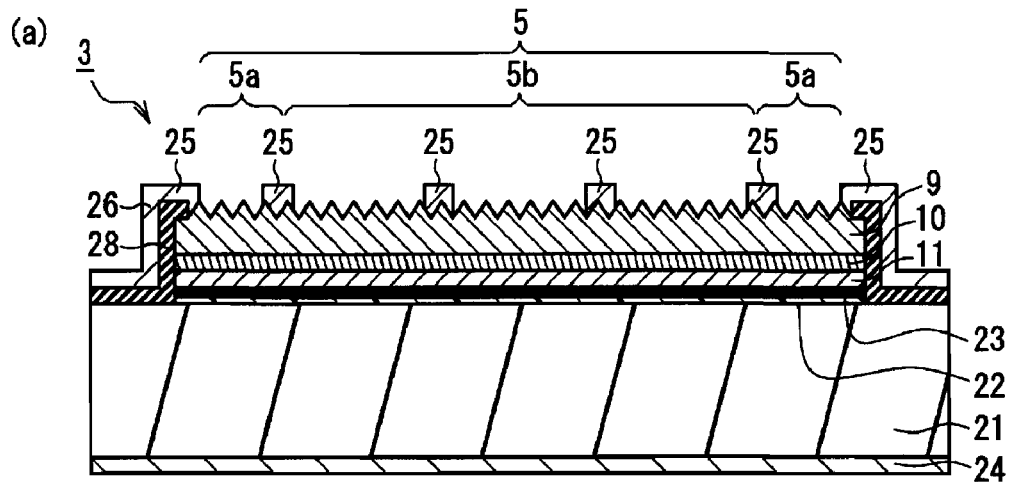
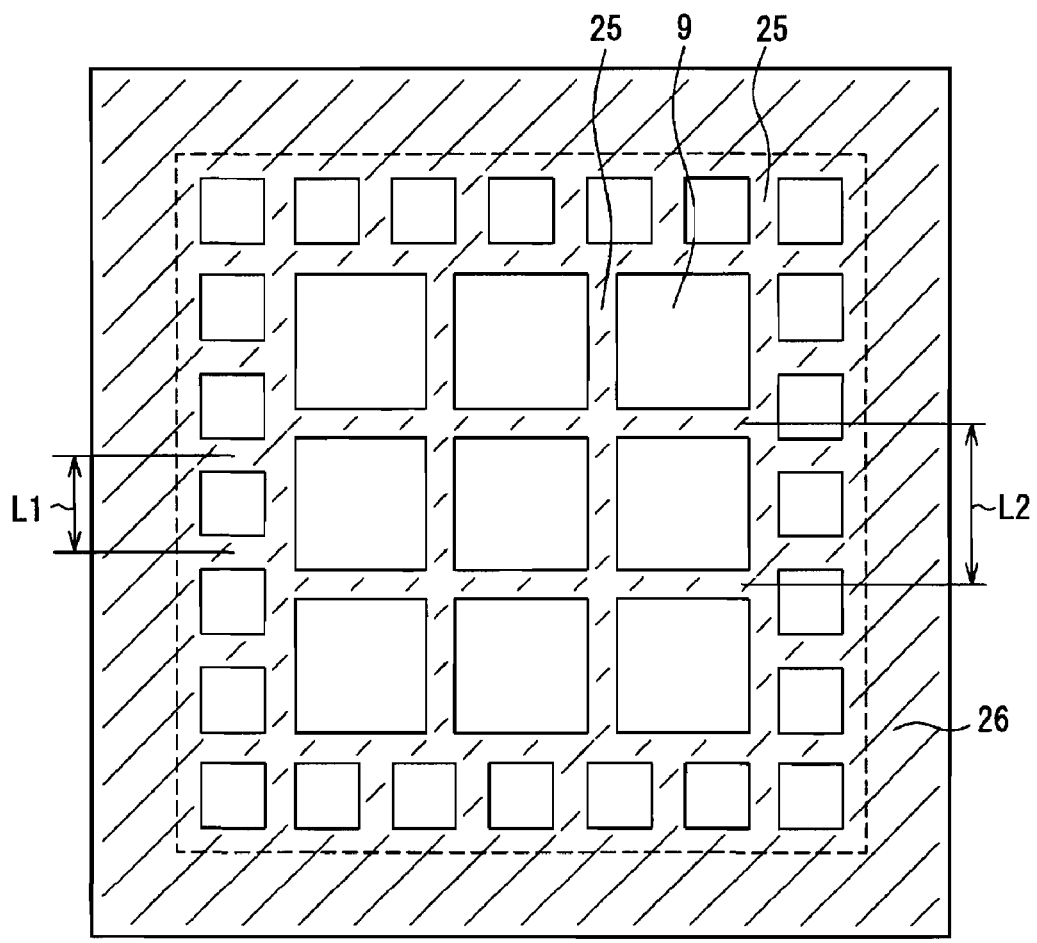

[Fig. 13]
(a)
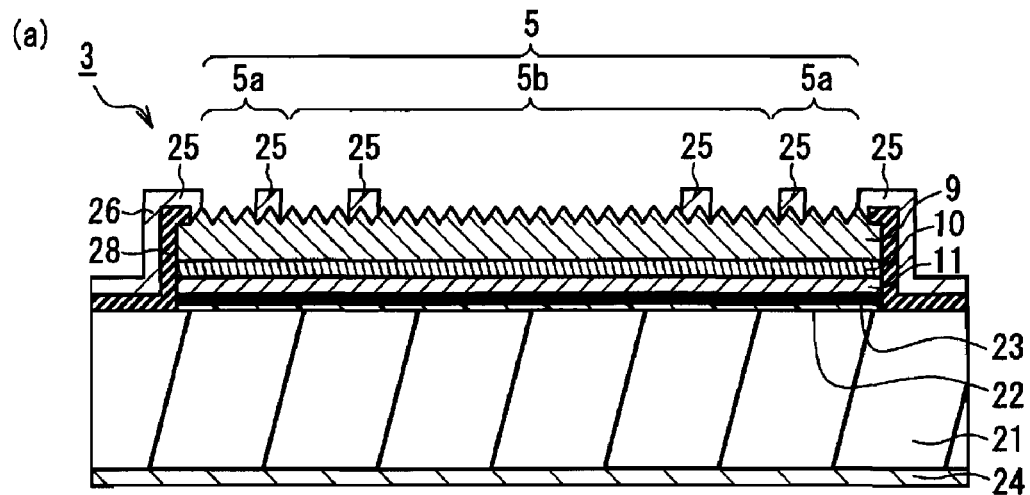
(b)
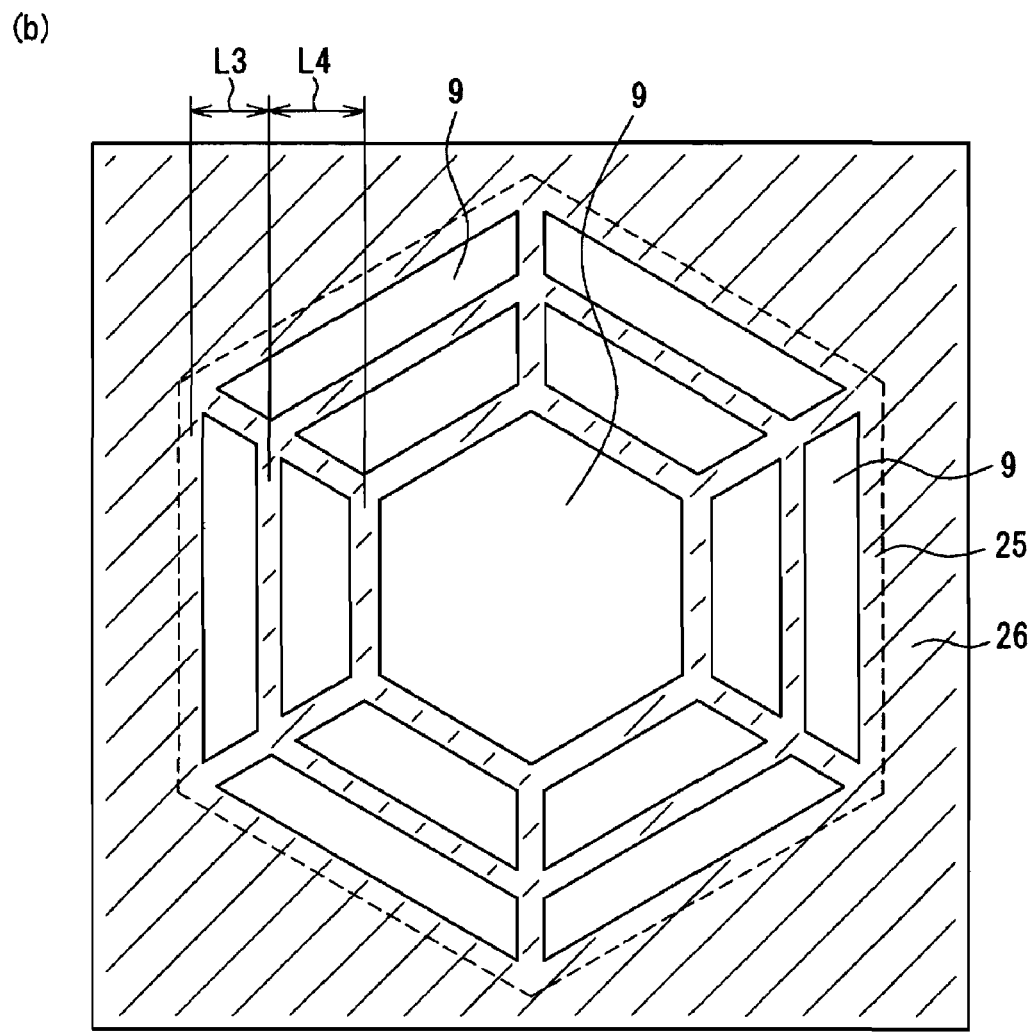

[Fig. 14]
(a)
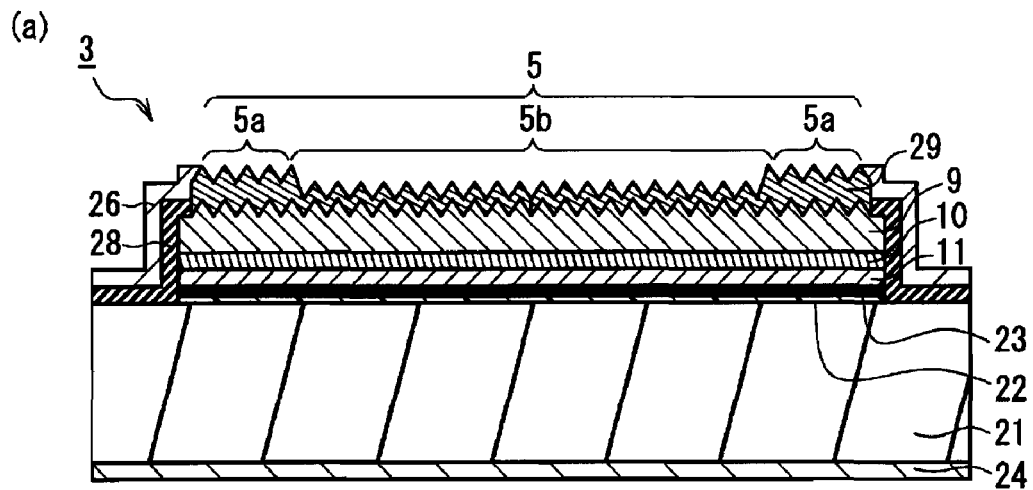
(b)
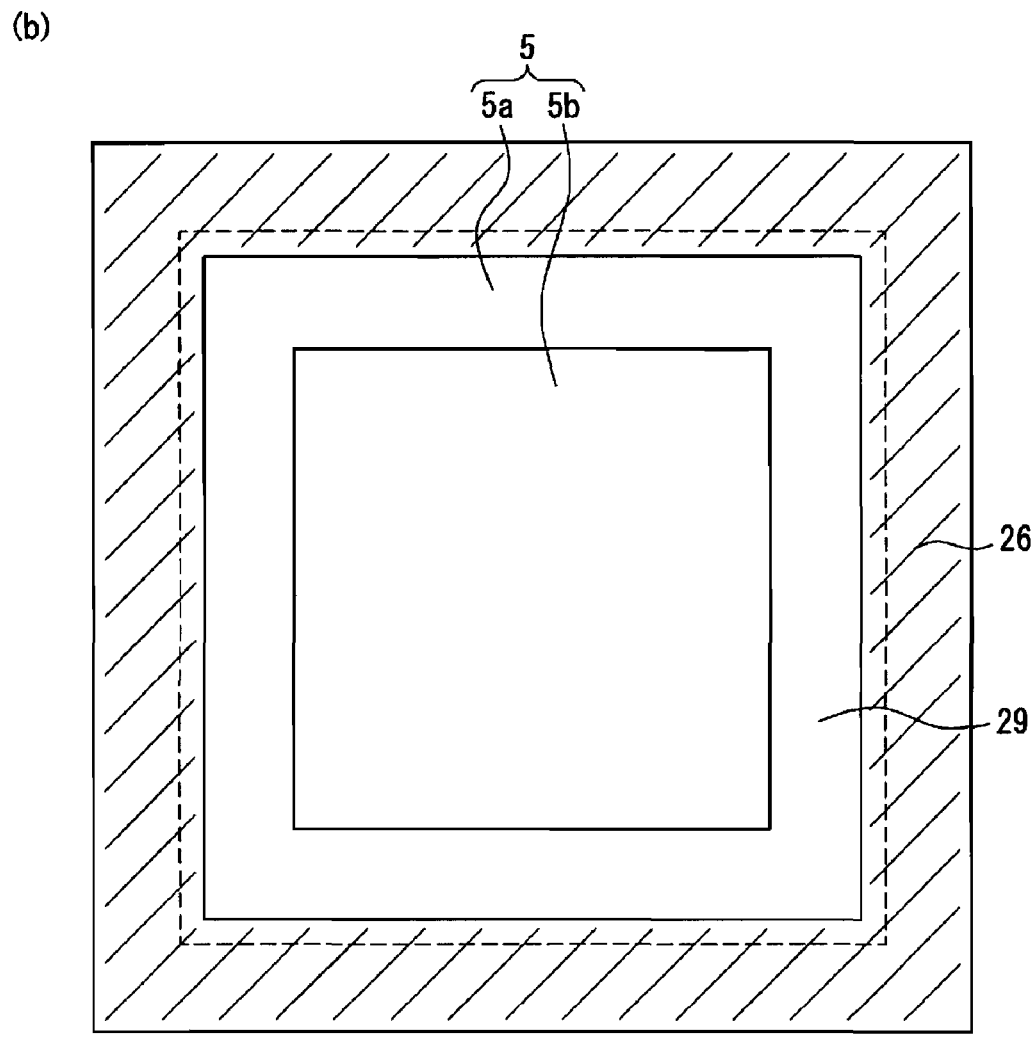

[Fig. 15]
(a)
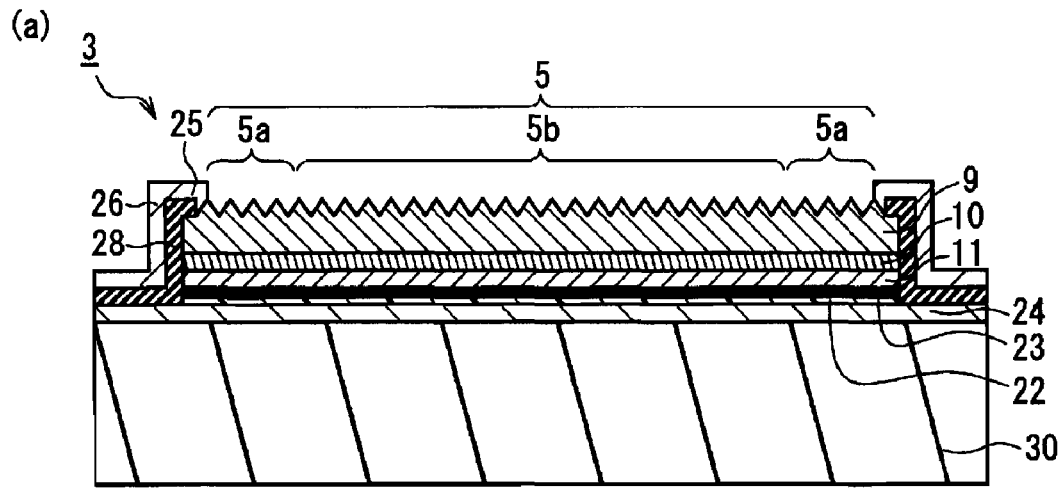
(b)
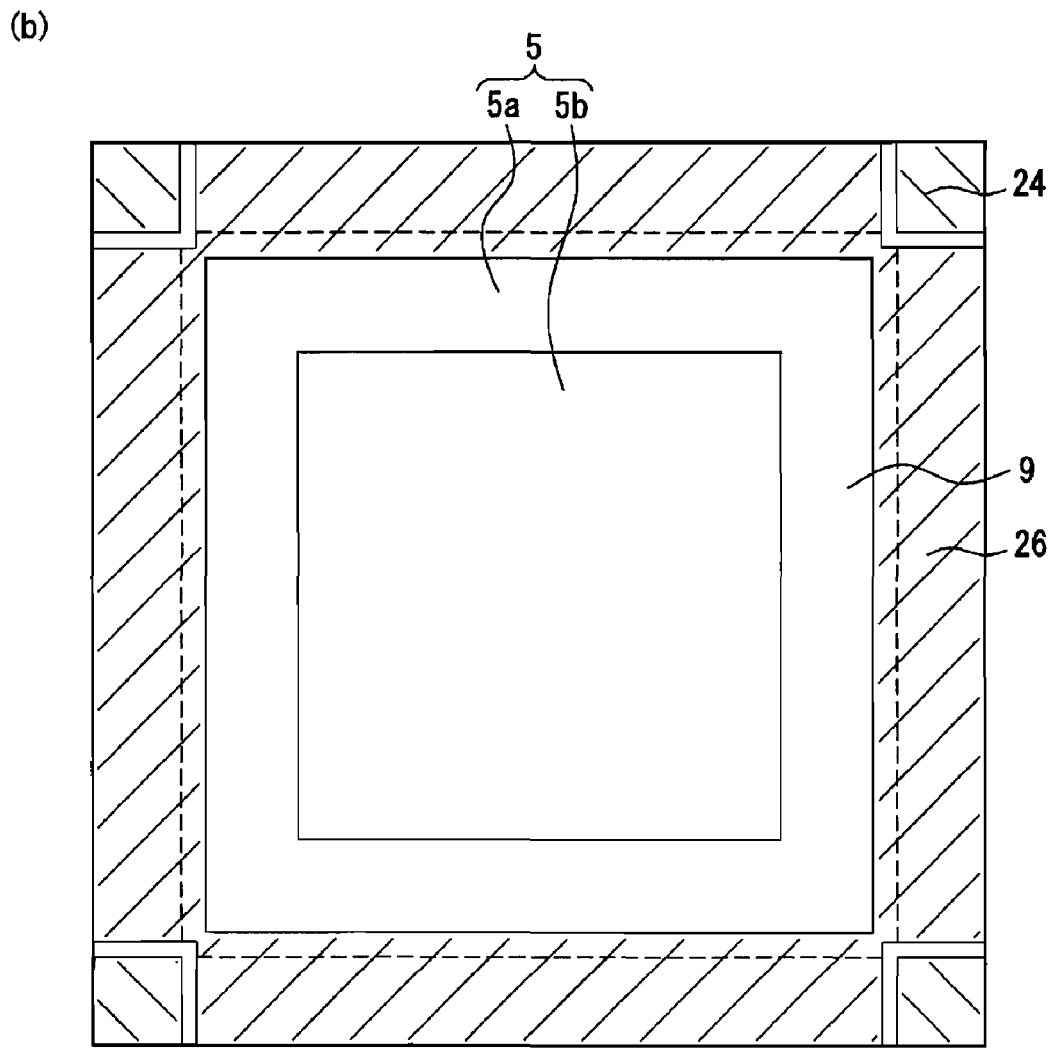

[Fig. 16]
(a)
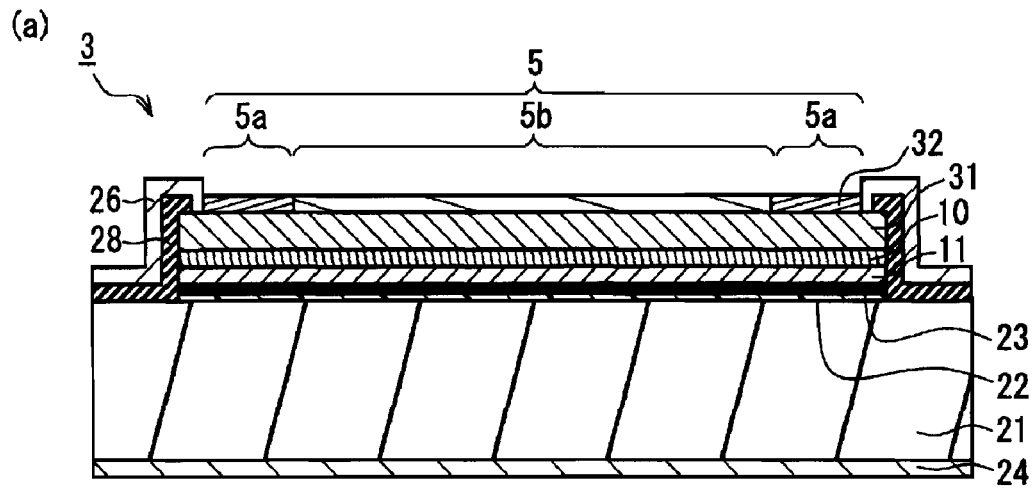
(b)
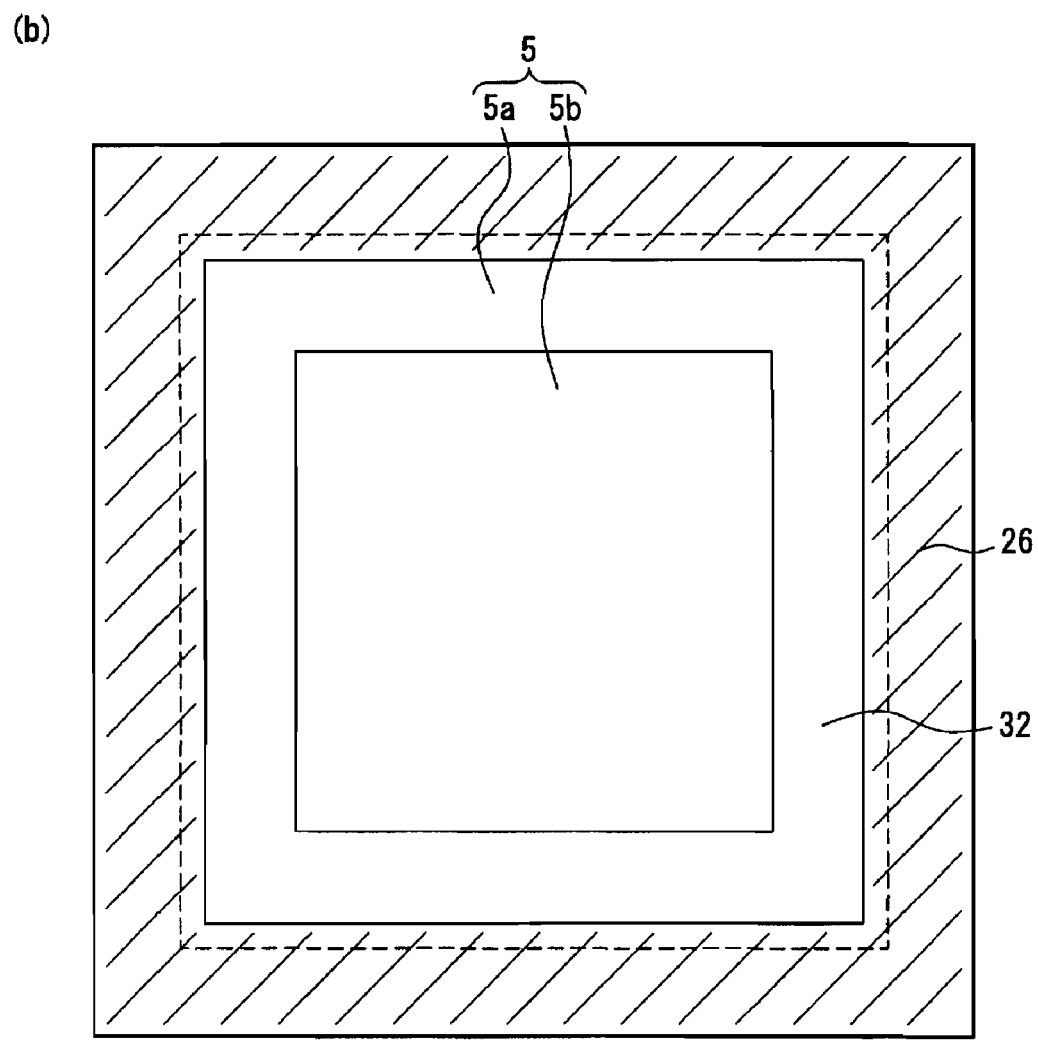

[Fig. 17]
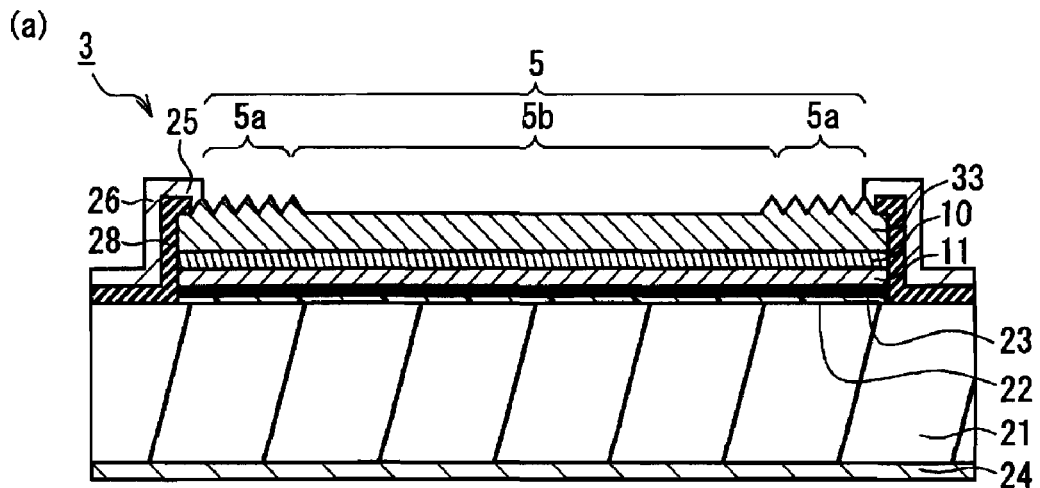
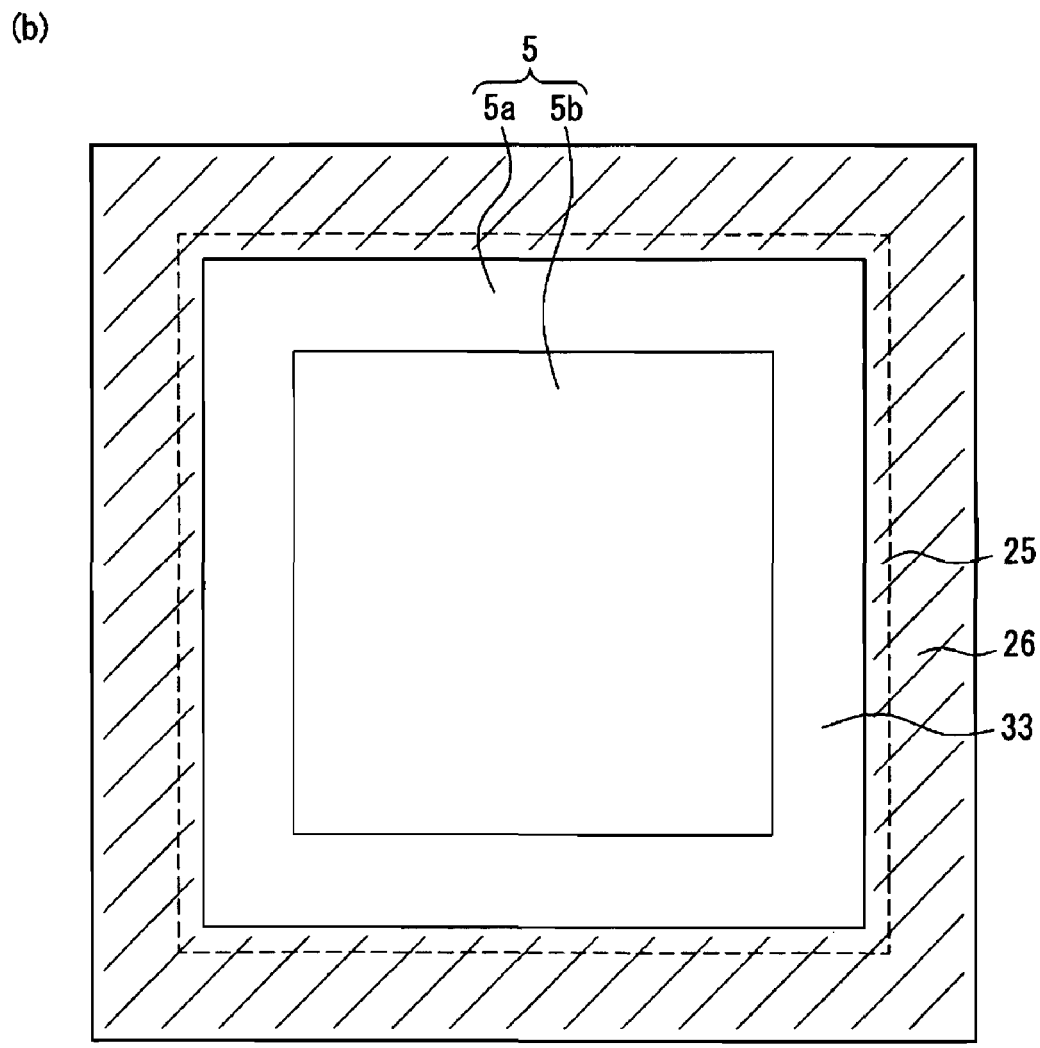

[Fig. 18]
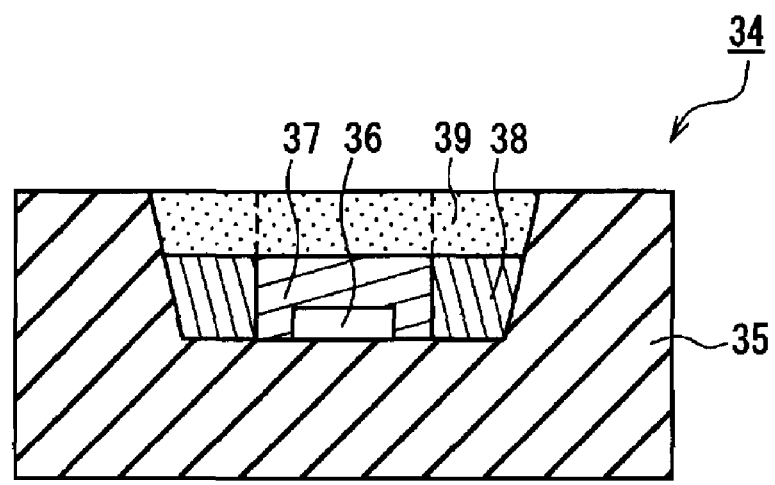

[Fig. 19]
(a)
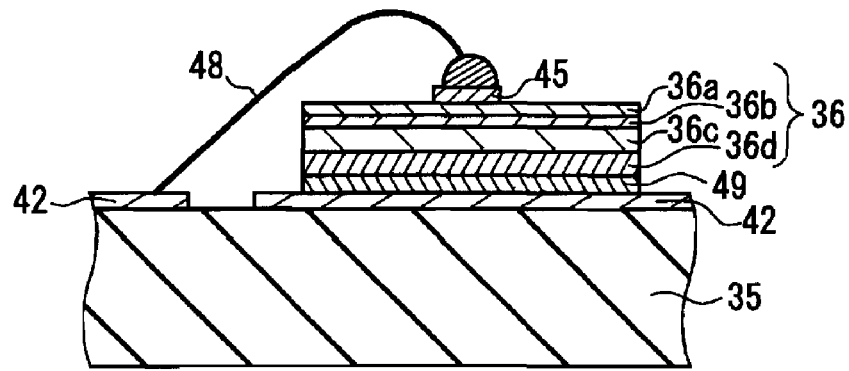
(b)
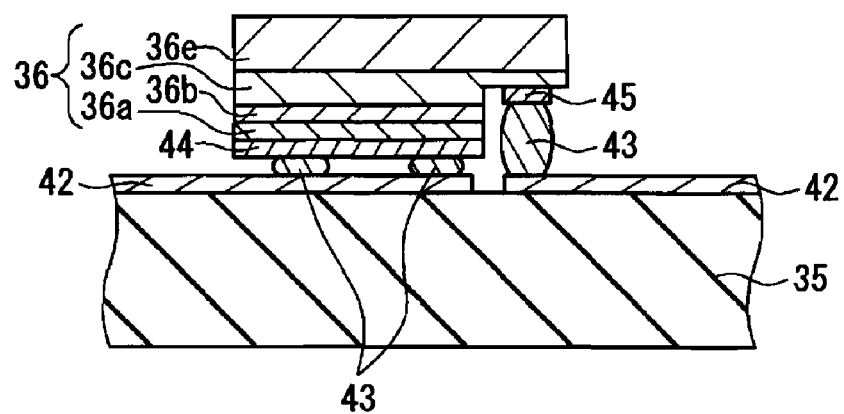
(c)
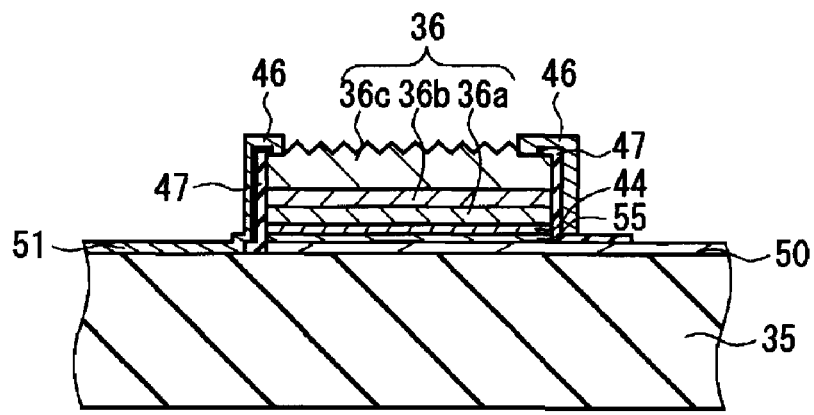

[Fig. 20]
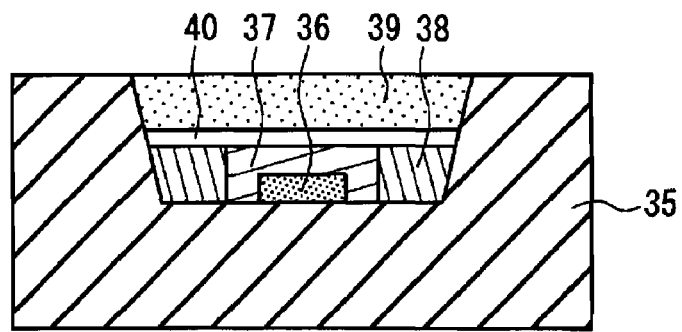
[Fig. 21]
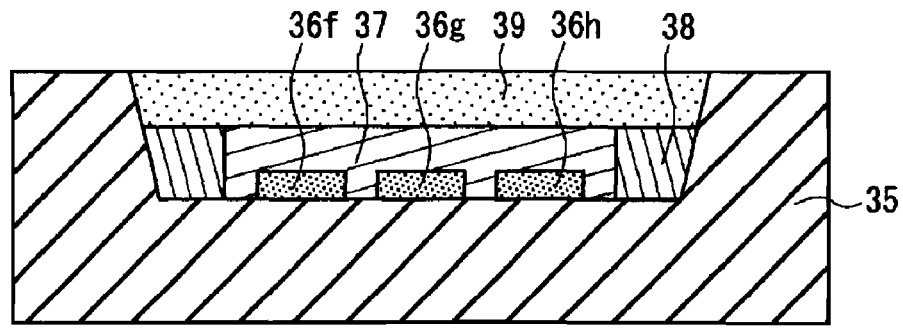
[Fig. 22]
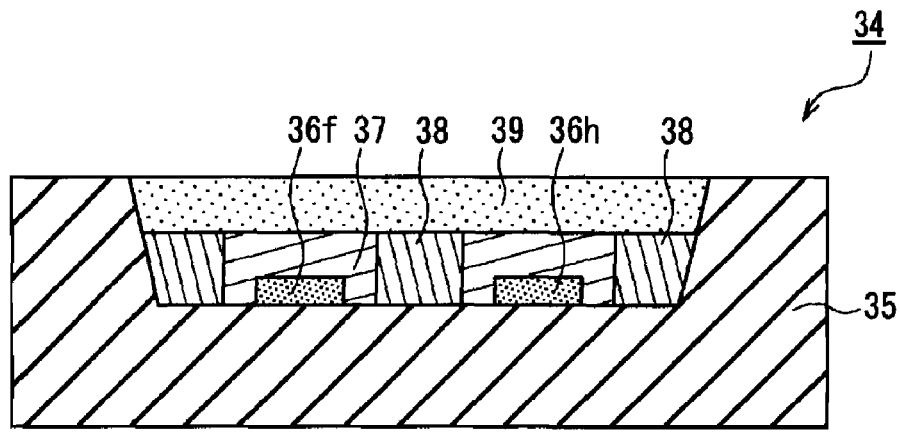

[Fig. 23]
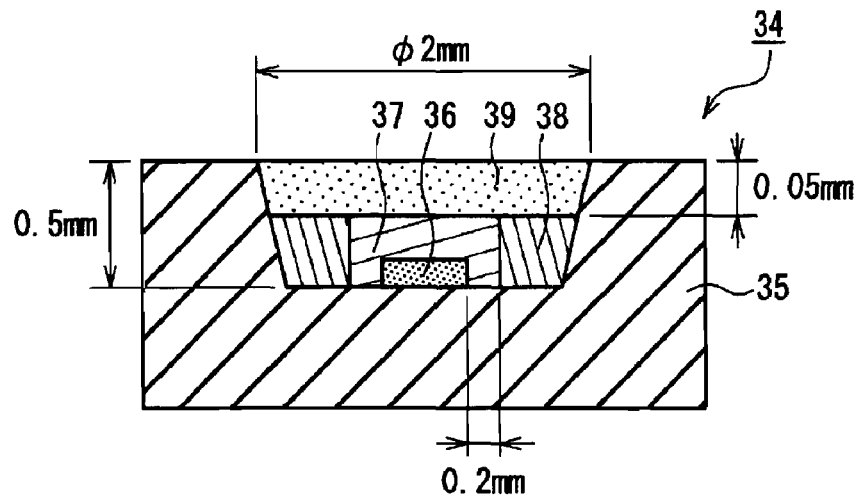
[Fig. 24]
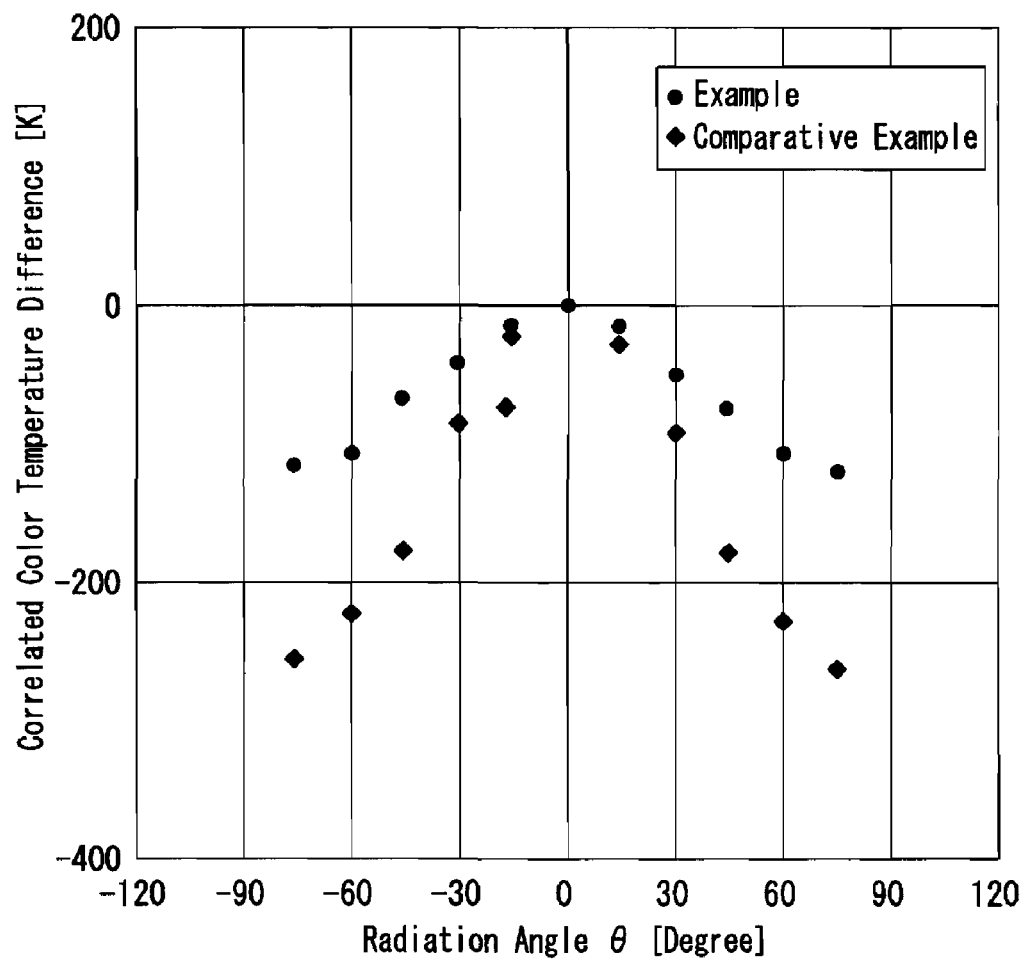

[Fig. 25]
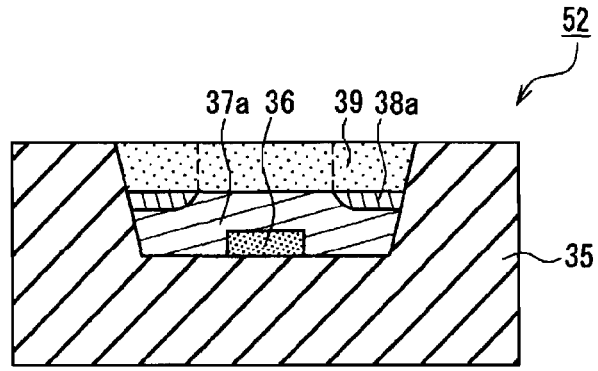
[Fig. 26]
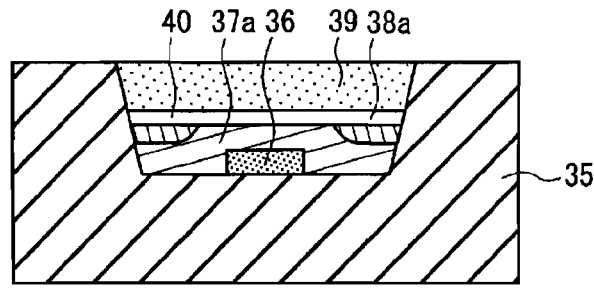
[Fig. 27]
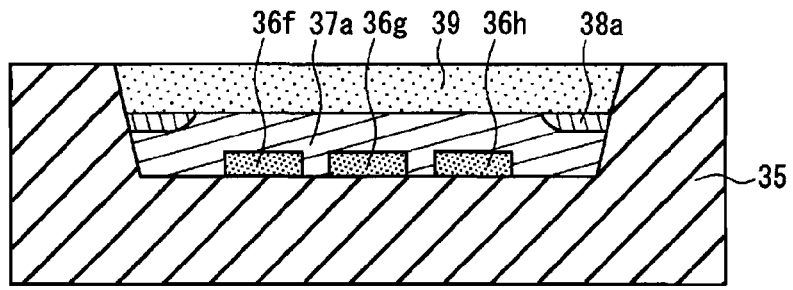
[Fig. 28]
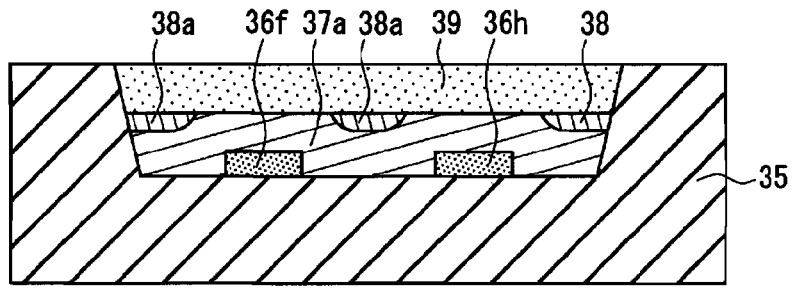

[Fig. 29]
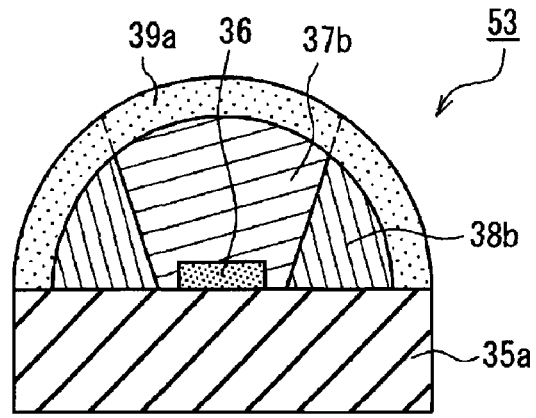
[Fig. 30]
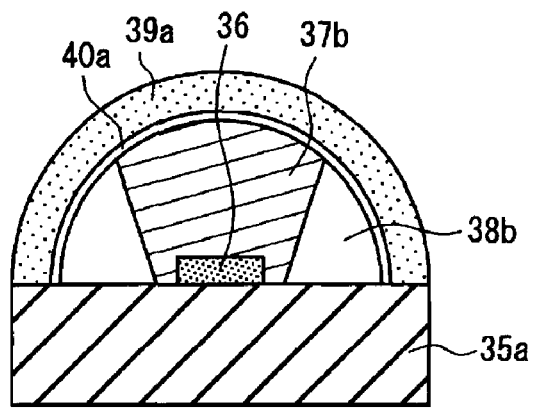
[Fig. 31]
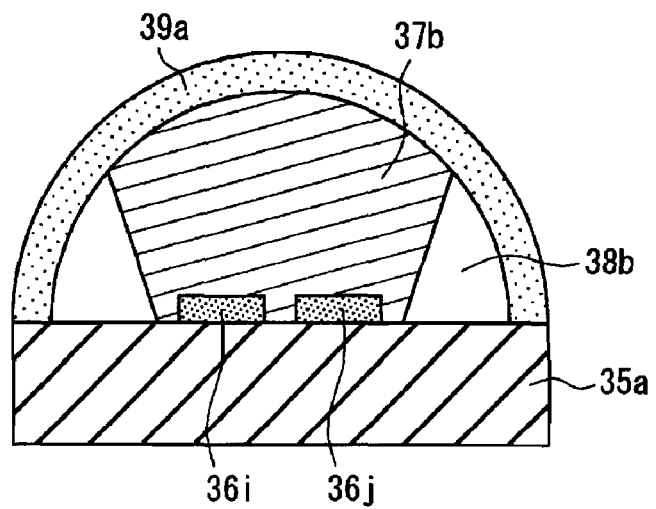

[Fig. 32]
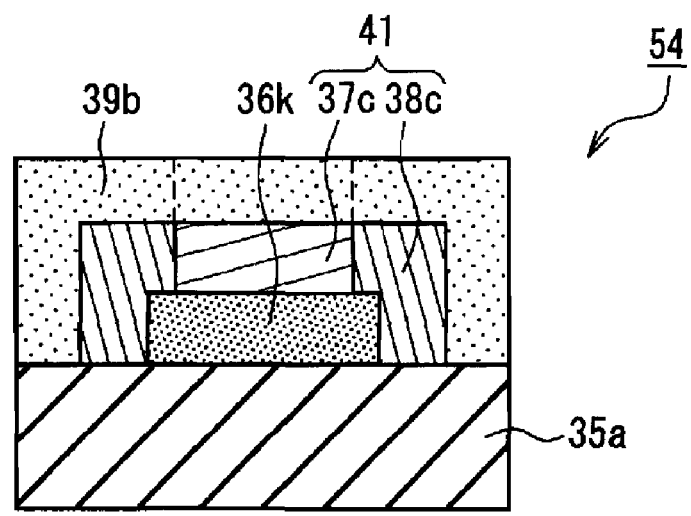
[Fig. 33]
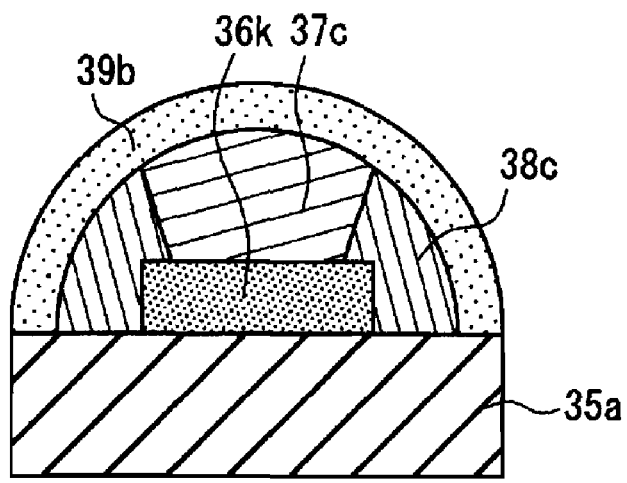

[Fig. 34]
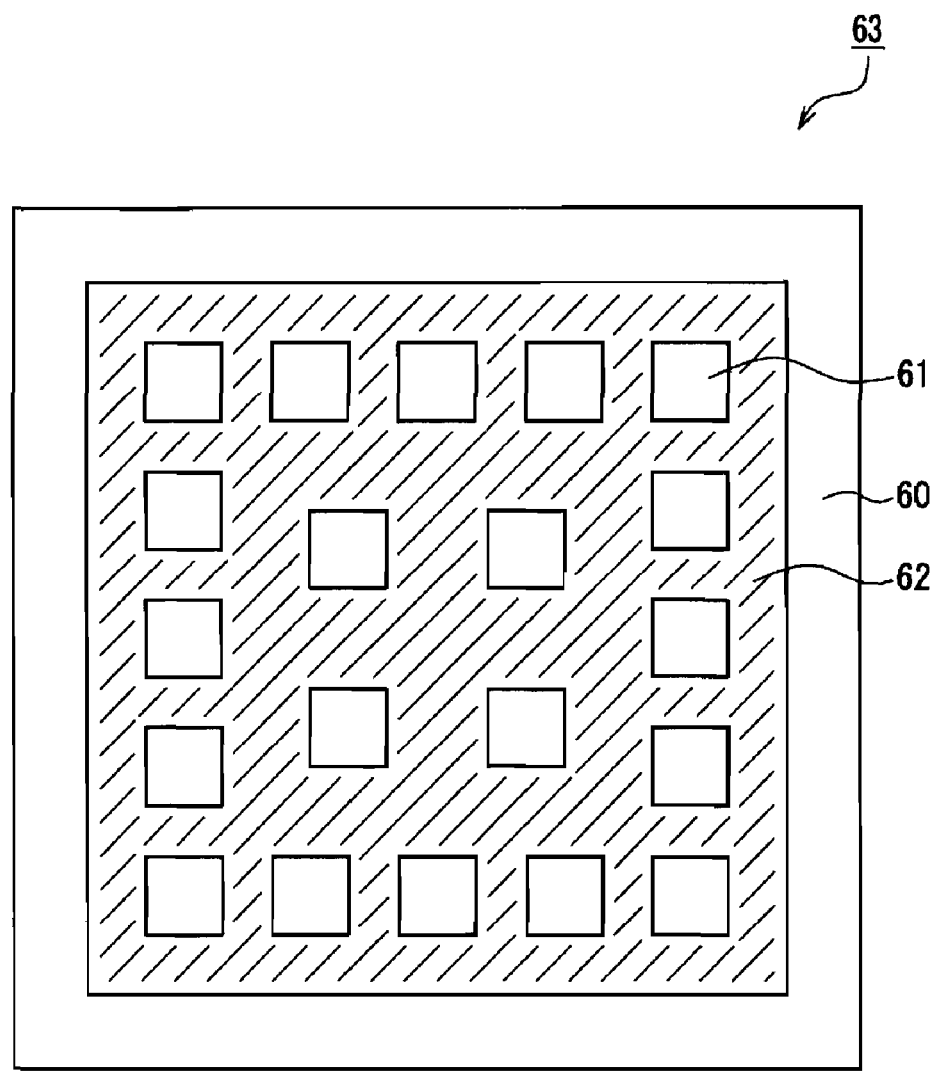

LIGHT-EMITTING DEVICE

The present application is a division of U.S. Ser. No. 12/515,372 filed May 18, 2009, now U.S. Pat. No. 8,008,673 issued Aug. 30, 2011, which is a national stage of PCT/JP2008/002071 filed Aug. 1, 2008.

TECHNICAL FIELD

The present invention relates to a light-emitting device that includes a light-emitting element such as a light-emitting diode (hereinafter referred to as an "LED").

BACKGROUND ART

LEDs are not only compact and highly efficient as compared to existing light sources that utilize electric discharge or radiation, but recently also are gaining an increased luminous flux. LEDs thus are expected to replace the existing light sources soon. Furthermore, because LEDs are more compact than light sources that utilize electric discharge or radiation, they have the following advantages: they have a wider range of applications, are easier to handle and are available in various designs as required. Accordingly, LEDs are considered as value-added light sources.

Light sources for lighting applications are required to have, as one of the characteristics, color uniformity, that is, no light color difference depending on the emitting direction of light emitted. In a light-emitting device that includes a wavelength converting material such as a fluorescent material, primary light emitted from the light-emitting element and secondary light obtained through absorption and conversion of the primary light by the wavelength converting material are combined, and light such as white light is emitted. In this case, the resulting color differs depending on the mixing ratio of the primary light and the secondary light. This mixing ratio may differ depending on the emitting direction, which causes a light color difference depending on the emitting direction, and a light color difference across the light-emitting surface (light extraction surface) of the wavelength converting portion.

The following methods have been proposed for suppressing such light color difference.

First, a method has been proposed in which a wavelength converting portion (a resin layer that includes fluorescent material particles) is formed on an LED chip serving as a light-emitting element uniformly over the shape of the LED chip (see, for example, Patent Document 1). With this configuration, the distance over which primary light passes through the wavelength converting portion can be made uniform, as compared to a configuration in which the wavelength converting portion is formed on the LED chip by dripping or the like, and it is therefore possible to suppress the light color difference in the light extraction surface of the wavelength converting portion.

Light sources for lighting applications that provide a high luminous flux are required to emit light of uniform color to the irradiation surface. Accordingly, a further reduction in the light color difference across the light extraction surface of the wavelength converting portion is necessary.

Inorganic fluorescent material particles, which usually are used as a wavelength converting material, are known to have a reflection function in addition to the wavelength converting function, so that a scattering action is effected, and as a result, primary light and secondary light are scattered, which can suppress the light color difference (see, for example, Patent Document 2).

Another method has been proposed in which the vicinity of the center of a wavelength converting portion that includes a wavelength converting material, that is, the area directly above a light-emitting element, is made thick and the periphery of the wavelength converting portion is made thin (see, for example, Patent Document 3). Patent Document 3 states that "by reducing a light path length difference across the wavelength converting portion between primary light that travels in the vertically upward direction from the light-emitting element and primary light that travels in an obliquely upward direction from the light-emitting element, the ratio between the primary light and the secondary light becomes substantially equal, and thus color nonuniformity is reduced". This is based on the model that "if the distribution of the wavelength converting material in the wavelength converting portion is uniform, the light path length has a correlation with the frequency at which primary light hits the wavelength converting material, and the ratio between the primary light and the secondary light is determined based on this frequency".

Another method has been proposed in which the vicinity of the center of a wavelength converting portion that includes a wavelength converting material, that is, the area directly above a light-emitting element, is caused to have a higher concentration of the wavelength converting material than that of the periphery of the wavelength converting portion (see, for example, Patent Document 4). This is based on the model that "if the thickness of the wavelength converting portion is uniform, by reducing a difference in frequency at which light hits the wavelength converting material of the wavelength converting portion between primary light that travels in the vertically upward direction from the light-emitting element and primary light that travels in an obliquely upward direction from the light-emitting element, the ratio between the primary light and the secondary light becomes substantially equal, and thus color nonuniformity is reduced".

Patent Citation 1: U.S. Pat. No. 6,468,821B2
Patent Citation 2: JP H7-99345A
Patent Citation 3: Japanese Patent No. 3065263 (paragraph [0016], FIG. 2)
Patent Citation 4: JP 2005-166733A (paragraph [0035], FIG. 8)

DISCLOSURE OF INVENTION

Technical Problem

In the vicinity of the center of a wavelength converting portion, primary light that is substantially uniformly scattered comes from the periphery of the vicinity of the center of the wavelength converting portion. However, in the edge portion, the direction of scattered primary light is limited to a single direction, that is, from within to the outer side of the wavelength converting portion. Because, in the edge portion, the primary light does not come from the external direction as described above, the mixed light emitted from the edge portion of the wavelength converting portion lacks the primary light component. Consequently, a difference occurs in the mixing ratio of primary light and secondary light between the edge portion of the light extraction surface of the wavelength converting portion and the inner region thereof, and this leads to a light color difference across the light extraction surface of the wavelength converting portion.

Ordinarily, the light intensity of light (primary light) emitted from a light-emitting element is high in the vertically upward direction of the emitting surface or in a direction slightly inclined from the vertically upward direction (hereinafter these are referred to as a "substantially vertically upward direction"), and is smaller as it moves in the lateral direction. In other words, the light intensity of the mixed light of primary light and secondary light that are mixed in the wavelength converting portion located in the substantially vertically upward direction of the light-emitting element is higher than that of the mixed light of primary light and secondary light that are mixed in the wavelength converting portion located in a direction obliquely upward from the lateral direction relative to the emitting surface. If the primary light can be caused to enter a wavelength converting portion having a uniform thickness and a uniform distribution of a wavelength converting material at a uniform intensity from the undersurface of the wavelength converting portion, uniformly mixed light can be emitted from the upper surface of the wavelength converting portion.

By increasing the distance between the light-emitting element and the wavelength converting portion, the influence of the distribution of light emitted from the light-emitting element in the light-emitting direction is reduced, and thus primary light having a substantially uniform intensity is caused to enter the undersurface of the wavelength converting portion. Accordingly, the color nonuniformity due to the distribution of light emitted from the light-emitting element is eliminated. However, in order to achieve a thin LED, the distance between the light-emitting element and the wavelength converting portion is made small, which increases the influence of the distribution of light emitted from the light-emitting element in the light-emitting direction, and becomes problematic when trying to achieve a thin LED with less color nonuniformity.

The present invention has been conceived in order to solve the above problem encountered in conventional technology, and it is an object of the present invention to provide a light-emitting device that can irradiate an irradiation surface with light of uniform color.

Technical Solution

In order to achieve the above object, a light-emitting device according to the present invention is configured as follows. A light-emitting device includes a base, and a light-emitting element that is disposed on the base and that emits primary light, wherein the light-emitting element is covered with a wavelength converting portion that includes a wavelength converting material that absorbs part of the primary light and emits secondary light, and the light-emitting device comprises a primary light intensity distribution control means for setting an intensity distribution of the primary light within the wavelength converting portion such that a mixing ratio of the primary light and the secondary light that are emitted from a light extraction surface of the wavelength converting portion is substantially uniform.

According to the configuration of the light-emitting device, the primary light intensity distribution control means is provided that sets the intensity distribution of the primary light within the wavelength converting portion such that mixed light of the primary light and the secondary light emitted from the light extraction surface of the wavelength converting portion is substantially uniform, and it is therefore possible to provide a light-emitting device that can irradiate an irradiation surface with light of uniform color.

In the configuration of the light-emitting device according to the present invention, it is preferable that a luminance of the primary light emitted from an edge portion of a light extraction surface provided on one principal surface of the light-emitting element is set higher than a luminance of the primary light emitted from an inner region that is located inside the edge portion. According to this preferred example, the luminance of the primary light emitted from the edge portion of the light extraction surface of the light-emitting element is set higher than that of the primary light emitted from the inner region located inside the edge portion, whereby a light color difference across the light extraction surface of the wavelength converting portion that covers the light-emitting element can be eliminated, and it is therefore possible to reduce the color nonuniformity of light extracted from the light-emitting device and to irradiate the irradiation surface with light of uniform color. In this case, it is preferable that the light-emitting element is divided into at least two diodes: a diode in the edge portion and a diode in the inner region located inside the edge portion. The diode in the edge portion and the diode in the inner region located inside the edge portion are connected in series, and the light-emitting layer of the diode in the edge portion has an area smaller than the area of the light-emitting layer of the diode in the inner region located inside the edge portion. According to this preferred example, because the current density of the light-emitting layer of the diode in the edge portion can be increased, it is possible to make the luminance of the primary light emitted from the edge portion of the light extraction surface of the light-emitting element higher than the luminance of the primary light emitted from the inner region located inside the edge portion. In this case, it is preferable that the light-emitting element is divided into at least two diodes: a diode in the edge portion and a diode in the inner region located inside the edge portion, and the diode in the edge portion and the diode in the inner region located inside the edge portion can be driven electrically independently of each other. According to this preferred example, a current can be injected such that the luminance of the primary light emitted from the edge portion of the light extraction surface of the light-emitting element is higher than the luminance of the primary light emitted from the inner region located inside the edge portion. In this case, it is preferable that at least one electrode of the light-emitting element is provided only in the edge portion. According to this preferred example, the current density of the edge portion of the light-emitting element can be increased, and it is therefore possible to make the luminance of the primary light emitted from the edge portion of the light extraction surface of the light-emitting element higher than the luminance of the primary light emitted from the inner region located inside the edge portion. In this case, it is preferable that, in at least one electrode of the light-emitting element, the electrode spacing in the edge portion is smaller than the electrode spacing in the inner region located inside the edge portion. According to this preferred example, the current density of the edge portion of the light-emitting element can be increased, so that the luminance of the primary light emitted from the edge portion of the light extraction surface of the light-emitting element becomes higher than the luminance of the primary light emitted from the inner region located inside the edge portion. In this case, it is preferable that, in at least one electrode, the electrode resistance of the edge portion is smaller than the electrode resistance of the inner region located inside the edge portion. According to this preferred example, the current density of the edge portion of the light-emitting element can be increased, so that the luminance of the primary light emitted from the edge portion of the light extraction surface of the light-emitting element becomes higher than the luminance of the primary light emitted from the inner region located inside the edge portion. In this case, it is preferable that, in the light-emitting element, the internal resistance of the inner region located inside the edge portion is larger than the internal resistance of the edge portion. According to this preferred example, the current density of the edge portion of the light-emitting element can be increased, so that the luminance of the primary light emitted from the edge portion of the light extraction surface of the light-emitting element becomes higher than the luminance of the primary light emitted from the inner region located inside the edge portion. In this case, it is preferable that, in the light-emitting element, the transmissivity of the primary light emitted from the edge portion is larger than the transmissivity of the primary light emitted from the inner region located inside the edge portion. According to this preferred example, the luminance of the primary light emitted from the edge portion of the light extraction surface of the light-emitting element can be made higher than the luminance of the primary light emitted from the inner region located inside the edge portion.

In the configuration of the light-emitting device of the present invention, it is preferable that the wavelength converting portion has a substantially uniform thickness, and a wavelength converting material is dispersed substantially uniformly.

In the configuration of the light-emitting device of the present invention, it is preferable that the light-emitting element is made up of a plurality of semiconductor layers including a light-emitting layer that emits primary light.

In the configuration of the light-emitting device of the present invention, it is preferable that the light-emitting element is covered with a cover portion, the cover portion is covered with the wavelength converting portion, and the refractive index of at least a portion of the cover portion in the outer periphery of the wavelength converting portion is set higher than the refractive index of the other portion of the cover portion.

In the configuration of the light-emitting device of the present invention, it is preferable that the light-emitting element is covered with a cover portion, the cover portion is covered with the wavelength converting portion, at least part of the cover portion includes a nanoparticle material, and at least a portion of the cover portion in the outer periphery of the wavelength converting portion includes a nanoparticle material having a refractive index higher than that of the base material of the cover portion.

In the configuration of the light-emitting device of the present invention, it is preferable that the light-emitting element is covered with a cover portion, the cover portion is covered with the wavelength converting portion, at least part of the cover portion includes a nanoparticle material, and at least a portion of the cover portion in the outer periphery of the wavelength converting portion includes a nanoparticle material at a ratio higher than that of the other portion of the cover portion.

According to these preferred examples, due to the tendency for light to concentrate on a portion having a high refractive index, the light intensity of the primary light in the directions ranging from the lateral direction to the obliquely upward direction, where the cover portion having a high refractive index is located, is relatively increased, and thus, in the cover portion as a whole, the intensity distribution of the primary light can be made uniform. In other words, the primary light can be caused to enter the wavelength converting portion having a uniform thickness and a uniform distribution of the wavelength converting material at a uniform intensity from the undersurface of the wavelength converting portion. Consequently, uniformly mixed light (of primary light and secondary light that is obtained through absorption and conversion of the primary light by the wavelength converting material) can be emitted from the upper surface of the wavelength converting portion, and it is therefore possible to reduce the color nonuniformity of light extracted from the light-emitting device.

In this case, it is preferable that the wavelength converting portion is formed into a dome shape. According to this preferred example, most of the light emitted from the light-emitting element is incident upon the wavelength converting portion perpendicularly to the wavelength converting portion, and it is therefore possible to prevent the reflection of light at the interface between the wavelength converting portion and the cover portion. Thereby, the light extraction efficiency can be improved further.

In this case, it is preferable that, in the wavelength converting portion, the refractive index of a portion that is located above the portion of the cover portion having a high refractive index is higher than the refractive index of the other part of the wavelength converting portion. According to this preferred example, in addition to the above-described effects, reflection at the interface between the cover portion and the wavelength converting portion can be reduced, and thus a loss caused by the reflection can be reduced. Furthermore, even in the wavelength converting portion, the intensity distribution can be made uniform.

In this case, it is preferable that a space is provided between the cover portion and the wavelength converting portion. According to this preferred example, heat from the light-emitting element can be dissipated with high efficiency.

In the configuration of the light-emitting device of the present invention, it is preferable that a plurality of the light-emitting elements are provided, and the plurality of light-emitting elements are covered with the wavelength converting portion that is continuous, and are disposed such that a spacing between adjacent light-emitting elements is decreased from a center portion side of the base gradually toward a periphery side thereof.

In the configuration of the light-emitting device of the present invention, it is preferable that a plurality of the light-emitting elements are provided, and the plurality of light-emitting elements are covered with the wavelength converting portion that is continuous, and are disposed such that a mounting density of the light-emitting elements per unit area of the wavelength converting portion is increased from a center portion side of the base gradually toward a periphery side thereof.

In the configuration of the light-emitting device of the present invention, it is preferable that a plurality of the light-emitting elements are provided, and the plurality of light-emitting elements are covered with the wavelength converting portion that is continuous, and are disposed such that a light-emitting efficiency of the wavelength converting portion is increased from a center portion side of the base gradually toward a periphery side thereof.

BRIEF DESCRIPTION OF THE DRAWINGS

FIG. 1 is a schematic cross-sectional view showing a light-emitting device according to Embodiment 1 of the present invention.

FIG. 2 schematically shows a light-emitting element that is used in the light-emitting device according to Embodiment 1 of the present invention. FIG. 2(a) is a cross-sectional view, and FIG. 2(b) is a plan view showing a light extraction surface.

FIG. 3 shows how the light-emitting device according to Embodiment 1 of the present invention is used. FIG. 3(a) shows the case where a sealing material is used, FIG. 3(b) shows the case where sealing gas is used, and FIG. 3(c) shows the case where sealing gas is used, and where the light-emitting device is formed into a module.

FIG. 4 shows diagrams that more specifically show a light-emitting element that is used in the light-emitting device according to Embodiment 1 of the present invention. FIG. 4(a) is a cross-sectional view, and FIG. 4(b) is a plan view showing a side opposite to the light extraction surface.

FIG. 5 shows diagrams that more specifically show a light-emitting element that is used in the light-emitting device according to Embodiment 1 of the present invention. FIG. 5(a) is a cross-sectional view, and FIG. 5(b) is a diagram showing the area ratio of a light-emitting layer.

FIG. 6 is a cross-sectional view that more specifically shows the light-emitting device according to Embodiment 1 of the present invention.

FIG. 7 is a schematic diagram used to illustrate a method for measuring the color temperature of light emitted from a light-emitting device in Embodiments 1 and 8 of the present invention.

FIG. 8 is a graph showing the result obtained through the evaluation of color nonuniformity of light emitted from the light-emitting device according to Embodiment 1 of the present invention.

FIG. 9 shows diagrams that more specifically show a light-emitting element that is used in a light-emitting device according to Embodiment 2 of the present invention. FIG. 9(a) is a cross-sectional view, and FIG. 9(b) is a plan view showing a side opposite to the light extraction surface.

FIG. 10 shows diagrams that more specifically show a light-emitting element that is used in a light-emitting device according to Embodiment 3 of the present invention. FIG. 10(a) is a cross-sectional view, and FIG. 10(b) is a plan view showing a light extraction surface.

FIG. 11 is a cross-sectional view that more specifically shows the light-emitting device according to Embodiment 3 of the present invention.

FIG. 12 shows diagrams that specifically show an example of a light-emitting element that is used in a light-emitting device according to Embodiment 4 of the present invention. FIG. 12(a) is a cross-sectional view, and FIG. 12(b) is a plan view showing a light extraction surface.

FIG. 13 shows diagrams that specifically show another example of the light-emitting element that is used in the light-emitting device according to Embodiment 4 of the present invention. FIG. 13(a) is a cross-sectional view, and FIG. 13(b) is a plan view showing a light extraction surface.

FIG. 14 shows diagrams that specifically show an example of a light-emitting element that is used in a light-emitting device according to Embodiment 5 of the present invention. FIG. 14(a) is a cross-sectional view, and FIG. 14(b) is a plan view showing a light extraction surface.

FIG. 15 shows diagrams that specifically show a light-emitting element that is used in a light-emitting device according to Embodiment 6 of the present invention. FIG. 15(a) is a cross-sectional view, and FIG. 15(b) is a plan view showing a light extraction surface.

FIG. 16 shows diagrams that specifically show an example of a light-emitting element that is used in a light-emitting device according to Embodiment 7 of the present invention. FIG. 16(a) is a cross-sectional view, and FIG. 16(b) is a plan view showing a light extraction surface.

FIG. 17 shows diagrams that specifically show another example of the light-emitting element that is used in the light-emitting device according to Embodiment 7 of the present invention. FIG. 17(a) is a cross-sectional view, and FIG. 17(b) is a plan view showing a light extraction surface.

FIG. 18 is a schematic cross-sectional view showing an example of a light-emitting device according to Embodiment 8 of the present invention.

FIG. 19 shows enlarged cross-sectional views used to illustrate a method for mounting a light-emitting element according to an embodiment of the present invention.

FIG. 20 is a schematic cross-sectional view showing another example of the light-emitting device according to Embodiment 8 of the present invention.

FIG. 21 is a schematic cross-sectional view showing still another example of the light-emitting device according to Embodiment 8 of the present invention.

FIG. 22 is a schematic cross-sectional view showing still another example of the light-emitting device according to Embodiment 8 of the present invention.

FIG. 23 is a schematic cross-sectional view showing a specific example of the light-emitting device according to Embodiment 8 of the present invention.

FIG. 24 is a graph showing the result obtained through the evaluation of color nonuniformity of light emitted from the light-emitting devices of a specific example and a comparative example in Embodiment 8 of the present invention.

FIG. 25 is a schematic cross-sectional view showing an example of a light-emitting device according to Embodiment 9 of the present invention.

FIG. 26 is a schematic cross-sectional view showing another example of the light-emitting device according to Embodiment 9 of the present invention.

FIG. 27 is a schematic cross-sectional view showing still another example of the light-emitting device according to Embodiment 9 of the present invention.

FIG. 28 is a schematic cross-sectional view showing still another example of the light-emitting device according to Embodiment 9 of the present invention.

FIG. 29 is a schematic cross-sectional view showing an example of a light-emitting device according to Embodiment 10 of the present invention.

FIG. 30 is a schematic cross-sectional view showing another example of the light-emitting device according to Embodiment 10 of the present invention.

FIG. 31 is a schematic cross-sectional view showing still another example of the light-emitting device according to Embodiment 10 of the present invention.

FIG. 32 is a schematic cross-sectional view showing an example of a light-emitting device according to Embodiment 11 of the present invention.

FIG. 33 is a schematic cross-sectional view showing another example of the light-emitting device according to Embodiment 11 of the present invention.

FIG. 34 is a plan view showing an example of a light-emitting device according to Embodiment 12 of the present invention.

EXPLANATION OF REFERENCE

1 Light-Emitting Device
2 Base
3 Light-Emitting Element
4 Wavelength Converting Portion
5 Light Extraction Surface of Light-Emitting Element
5a Edge Portion of Light Extraction Surface of Light-Emitting Element
5b Inner Region Located inside Edge Portion of Light Extraction Surface of Light-Emitting Element
6 Light Extraction Surface of Wavelength Converting Portion
34, 52, 53, 54 Light-Emitting Device 35, 35a Base
36, 36f, 36g, 36h, 36i, 36j, 36k Light-Emitting Element
37, 37a, 37b, 37c First Cover Portion
38, 38a, 38b, 38c Second Cover Portion
39, 39a, 39b Wavelength Converting Portion
40, 40a Space
41 Cover Portion
60 Base
61 Light-Emitting Element
62 Wavelength Converting Portion
63 Light-Emitting Device

BEST MODE FOR CARRYING OUT THE INVENTION

Hereinafter, the present invention will be described in further detail with reference to embodiments.

Embodiment 1

A light-emitting device according to Embodiment 1 of the present invention will be described first with reference to FIGS. 1 to 6. FIG. 1 is a schematic cross-sectional view showing the light-emitting device according to the present embodiment. FIG. 2 schematically shows a light-emitting element that is used in the light-emitting device according to the present embodiment. FIG. 2(a) is a cross-sectional view, and FIG. 2(b) is a plan view showing a light extraction surface. FIG. 3 shows how the light-emitting device according to the present embodiment is used. FIG. 3(a) shows the case where a sealing material is used, FIG. 3(b) shows the case where sealing gas is used, and FIG. 3(c) shows the case where sealing gas is used, and where the light-emitting device is formed into a module. FIG. 4 shows diagrams that more schematically show a light-emitting element that is used in the light-emitting device according to the present embodiment. FIG. 4(a) is a cross-sectional view, and FIG. 4(b) is a plan view showing a side opposite to the light extraction surface. FIG. 5 shows diagrams that more specifically show a light-emitting element that is included in the light-emitting device according to the present embodiment. FIG. 5(a) is a cross-sectional view, and FIG. 5(b) is a diagram showing the area ratio of a light-emitting layer. FIG. 6 is a cross-sectional view that more specifically shows the light-emitting device according to the present embodiment.

As shown in FIG. 1, a light-emitting device 1 according to the present embodiment includes a flat plate-like base 2, and a single light-emitting element 3 that is disposed on the base 2. The light-emitting element 3 is made up of a plurality of semiconductor layers including a light-emitting layer, and is covered tightly with a wavelength converting portion 4 that includes a wavelength converting material. The wavelength converting portion 4 has a uniform thickness, and the wavelength converting material is uniformly dispersed.

The light-emitting layer of the light-emitting element 3 emits primary light, and the wavelength converting material of the wavelength converting portion 4 absorbs the primary light and then emits secondary light.

As shown in FIGS. 2(a) and 2(b), the light-emitting element 3 is configured such that the luminance of primary light emitted from an edge portion 5a of a light extraction surface 5 is higher than the luminance of primary light emitted from an inner region 5b that is located inside the edge portion 5a. Thereby, the mixing ratio of the primary light and the secondary light that are emitted from a light extraction surface 6 (see FIG. 1) of the wavelength converting portion 4 becomes substantially uniform across the light extraction surface 6 of the wavelength converting portion 4. In other words, the light-emitting device 1 of the present embodiment includes a primary light intensity distribution control means for setting the intensity distribution of the primary light within the wavelength converting portion 4 such that the mixing ratio of the primary light and the secondary light that are emitted from the light extraction surface 6 of the wavelength converting portion 4 is substantially uniform.

According to the light-emitting device 1 of the present embodiment, because the light-emitting element 3 is configured such that the luminance of primary light emitted from the edge portion 5a of the light extraction surface 5 is higher than the luminance of primary light emitted from the inner region 5b located inside the edge portion 5a, a light color difference across the light extraction surface 6 of the wavelength converting portion 4 that covers the light-emitting element 3 can be eliminated, and it is therefore possible to irradiate the irradiation surface with light of uniform color.

The material constituting the base 2 is not limited to a particular material, and it is possible to use, for example, monocrystals such as sapphire, Si, GaN, AlN, ZnO, SiC, BN and ZnS; ceramics such as $Al_2O_3$, MN, BN, MgO, ZnO, SiC and C, and mixtures thereof; metals such as Al, Cu, Fe, Au and W, and alloys that include these metals; glass epoxy; resins such as epoxy resin, silicone resin, acrylic resin, urea resin, amide resin, imide resin, polycarbonate resin, polyphenyl sulfide resin, liquid crystal polymer, acrylonitrile-butadiene-styrene resin (ABS resin), methacrylate resin (PMMA resin) and cyclic olefin copolymer, and mixtures thereof. These materials also may be used as materials for a growth substrate of the light-emitting element 3. Accordingly, the base 2 may also serve as a growth substrate of the light-emitting element 3. Other than a configuration in which a film epitaxially grown on a growth substrate, which is made of sapphire, SiC, GaN, Si or the like, of the light-emitting element 3 is disposed on the base 2, a configuration to dispose the light-emitting element 3 on the base 2 such that this growth substrate does not remain can be used.

There is no particular limitation on the configuration and mounting method of the light-emitting element 3. Examples of the configuration of the base include a lead frame base, a package base in which a light-emitting element is mounted, and a submount base that is interposed between a light-emitting element and a package base. As the light-emitting element 3, it is possible to use, for example, a green LED that emits green light having a wavelength of 500 to 550 nm, a blue LED that emits blue light having a wavelength of 420 to 500 nm, a blue-violet LED that emits blue-violet light having a wavelength of 380 to 420 nm, and an ultraviolet LED having an even shorter wavelength. In the case of a nitride semiconductor material, it is represented by a general formula: $B_zAl_xGa_{1-x-y-z}In_yN$ (where x is in the range of 0 to 1, y is in the range of 0 to 1, z is in the range of 0 to 1, and x+y+z is in the range of 0 to 1). Hereinafter, this is referred to as "GaN-based semiconductor". It is also possible to use a II-VI group semiconductor material such as ZnS or ZnO.

The light-emitting element is not limited to those made of a compound semiconductor material, and it is also possible to use, for example, a light-emitting element made of an organic semiconductor material or inorganic semiconductor material.

The wavelength converting portion 4 is made of, for example, a wavelength converting material, and a light-transmitting material serving as a base material for dispersing the wavelength converting material.

As the wavelength converting material, for example, a fluorescent material can be used. As the fluorescent material, it is possible to use, for example, a red fluorescent material that emits red light, an orange fluorescent material that emits orange light, a yellow fluorescent material that emits yellow light, a green fluorescent material that emits green light, and so on. As the red fluorescent material, it is possible to use, for example, a silicate-based material such as $Ba_3MgSi_2O_8$: $Eu^{2+}$, $Mn^{2+}$, a nitridosilicate-based material such as $Sr_2Si_5N_8:Eu^{2+}$, a nitridoaluminosilicate-based material such as $CaAlSiN_3:Eu^{2+}$, an oxonitridoaluminosilicate-based material such as $Sr_2Si_4AlON_7:Eu^{2+}$, a sulfide-based material such as (Sr, Ca)$S:Eu^{2+}$, $La_2O_2S:Eu^{3+}$, and so on. As the orange fluorescent material, it is possible to use, for example, a silicate-based material such as (Sr, Ca)$_2SiO_4:Eu^{2+}$, a garnet-based material such as $Gd_3Al_5O_{12}:Ce^{3+}$, a Ca-alpha-sialon-based material such as Ca-alpha-SiAlON:$Eu^{2+}$, and so on. As the yellow fluorescent material, it is possible to use, for example, a silicate-based material such as (Sr, Ba)$_2SiO_4$: $Eu^{2+}$, a garnet-based material such as (Y, Gd)$_3Al_5O_{12}:Ce^{3+}$, a sulfide-based material such as $CaGa_2S_4:Eu^{2+}$, a Ca-alpha-sialon-based material such as Ca-alpha-SiAlON:$Eu^{2+}$, and so on. As the green fluorescent material, it is possible to use, for example, an aluminate-based material such as $BaMgAl_{10}O_{17}:Eu^{2+}$, $Mn^{2+}$ or (Ba, Sr, Ca)$Al_2O_4:Eu^{2+}$, a silicate-based material such as (Ba, Sr)$_2SiO_4:Eu^{2+}$, a Ca-alpha-sialon-based material such as Ca-alpha-SiAlON:$Yb^{2+}$, a beta-sialon-based material such as beta-$Si_3N_4:Eu^{2+}$, an oxonitridoaluminosilicate-based material such as (Ba, Sr, Ca)$_2Si_4AlON_7:Ce^{3+}$, a sulfide-based material such as $SrGa_2S_4:Eu^{2+}$, a garnet-based material such as $Y_3(Al, Ga)_5O_{12}:Ce^{3+}$, $Y_3Al_5O_{12}:Ce^{3+}$, $Ca_3Sr_2Si_3O_{12}:Ce^{3+}$ or $BaY_2SiAl_4O_{12}:Ce^{3+}$, an oxide-based material such as $CaSc_2O_4:Ce^{3+}$, and so on. The light emitted from the upper surface of the wavelength converting portion is not limited to white light, and fine light color designs are possible by selecting these fluorescent materials as appropriate. And infinite variations are possible by using a plurality of different types of fluorescent materials having different luminous wavelengths. Other than the configuration in which the wavelength converting material is dispersed uniformly in the wavelength converting portion, the wavelength converting portion can have, for example, a configuration in which the concentration of the wavelength converting material is changed from the undersurface of the wavelength converting portion substantially gradually toward the upper surface thereof, a configuration in which layers made of different wavelength converting materials are laminated, a configuration in which cells made of different wavelength converting materials are arranged in a matrix form, or the like. With any of the above-described configurations, uniformly mixed light can be emitted from the upper surface of the wavelength converting portion by causing primary light to enter the undersurface of the wavelength converting portion at a uniform intensity.

As the light-transmitting material, any material can be used as long as it allows the light extracted from the light-emitting device 1 to pass therethrough. Examples thereof include resins such as epoxy resin, silicone resin, acrylic resin, urea resin, amide resin, imide resin, polycarbonate resin, polyphenyl sulfide resin, liquid crystal polymer, ABS resin, PMMA resin and cyclic olefin copolymer; resins made of a mixture thereof; glass that is formed by the sol-gel method using metal alkoxide or colloidal silica as a starting material; and glass such as low melting point glass. It is also possible to use a composite material obtained by dispersing metal oxide particles in the light-transmitting material serving as a base material. When a curable resin is used as the base material, the thixotropy of the curable resin before being cured can be improved by dispersing the metal oxide particles in the curable resin in an uncured state, so that the wavelength convert-ing portion 4 can be formed easily into a desired shape. Furthermore, because the heat conductivity is improved as compared to the case of using a resin alone, heat from the light-emitting element 3 can be dissipated with high efficiency.

When a blue-violet LED or ultraviolet LED is used as the light-emitting element 3, for example, the above-described fluorescent material may be combined with a blue fluorescent material that emits blue light or a blue-green fluorescent material that emits blue-green light. As the blue fluorescent material, it is possible to use, for example, an aluminate-based material such as $BaMgAl_{10}O_{17}:Eu^{2+}$, a silicate-based material such as $Ba_3MgSi_2O_8:Eu^{2+}$, a halophosphate-based material such as (Sr, Br)$_{10}(PO_4)_6Cl_2:Eu^{2+}$, and so on. As the blue-green fluorescent material, it is possible to use, for example, an aluminate-based material such as $Sr_4Al_{14}O_{25}$: $Eu^{2+}$, a silicate-based material such as $Sr_2Si_3O_8$-2$SiCl_2$: $Eu^{2+}$, and so on.

When actually using the above-described light-emitting device 1, for example, as shown in FIG. 3(a), the light-emitting device 1 is disposed at the bottom of a recess of the base 55, and the recess is filled with a sealing material 56. Alternatively, as shown in FIG. 3(b), the light-emitting device 1 may be disposed on the upper surface of a flat plate-like base 57, and a sealing gas 58 may be filled around the light-emitting device 1. Alternatively, as shown in FIG. 3(c), a plurality of light-emitting devices 1', each of which includes a light-emitting element 3 and a wavelength converting portion 4, may be disposed on the upper surface of a flat plate-like base 57, and a sealing gas 58 may be filled around each light-emitting device 1' to form a light-emitting module.

As the sealing material 56, it is possible to use, for example, resins such as epoxy resin, silicone resin, acrylic resin, urea resin, amide resin, imide resin, polycarbonate resin, polyphenyl sulfide resin, liquid crystal polymer, ABS resin, PMMA resin and cyclic olefin copolymer; resins made of a mixture of these resins; glass that is formed by sol-gel method using metal alkoxide or colloidal silica as a starting material; or glass such as low melting point glass.

As the sealing gas 58, for example, an inert gas, such as nitrogen or argon, or dry air can be used.

Hereinafter, the light-emitting device 1 of the present embodiment and a light-emitting element 3 that can be used in the light-emitting device 1 will be described in further detail with reference to FIGS. 4 to 6.

As shown in FIGS. 4(a) and 4(b), a GaN semi-insulating layer 8 is formed on one principal surface of a growth substrate 7 made of GaN, SiC, sapphire or the like, and an n-GaN-based semiconductor layer 9, a light-emitting layer 10, and a p-GaN-based semiconductor layer 11 are laminated in this order on the GaN semi-insulating layer 8. The other principal surface (light extraction surface 5) of the growth substrate 7 is processed to have an uneven structure. Thereby, the light extraction efficiency of the light-emitting device can be improved.

An isolation groove 12 for separating the light-emitting element 3 into a portion corresponding to the edge portion 5a of the light extraction surface 5 and a portion corresponding to the inner region 5b located inside the edge portion 5a is provided such that the isolation groove 12 spans across the n-GaN-based semiconductor layer 9, the light-emitting layer 10, the p-GaN-based semiconductor layer 11, and part of the GaN semi-insulating layer 8. Thereby, the light-emitting element 3 is divided into two diodes: a diode in the edge portion and a diode in the inner region located inside the edge portion.

A Rh/Pt/Au electrode 13 which is a highly reflective electrode is provided as an anode electrode on the p-GaN-based semiconductor layer 11 at the edge portion and the inner region located inside the edge portion, and the Rh/Pt/Au electrode 13 of the edge portion is electrically connected to an anode terminal 14. Likewise, a Ti/Au electrode 15 serving as a cathode electrode is provided in the n-GaN-based semiconductor layer 9 at the edge portion and the inner region located inside the edge portion, and the Ti/Au electrode 15 of the inner region located inside the edge portion is electrically connected to a cathode terminal 16.

The Ti/Au electrode 15 of the edge portion as a cathode electrode and the Rh/Pt/Au electrode 13 of the inner region located inside the edge portion as an anode electrode are connected electrically via a wiring layer 17. Thereby, as shown in FIG. 4(b), the diode D1 of the edge portion and the diode D2 of the inner region located inside the edge portion are connected in series.

In the present embodiment, the light-emitting element 3 is disposed on the base 2 such that the growth substrate 7 remains, but a configuration may be employed in which the light-emitting element 3 is disposed on the base 2 such that the growth substrate 7 does not remain, as in an embodiment described later.

An insulating layer 18 made of silicon nitride is interposed between the anode terminal 14 and the wiring layer 17, between the wiring layer 17 and the n-GaN-based semiconductor layer 9, light-emitting layer 10 and p-GaN-based semiconductor layer 11, and between the cathode terminal 16 and the wiring layer 17, n-GaN-based semiconductor layer 9, light-emitting layer 10 and p-GaN-based semiconductor layer 11.

As the electrode material, Ag, Al, Au, Ni, Rh, Pd, Pt, Ti, W, Cu, or alloys that are made thereof, ITO (indium tin oxide), ZnO and so on can be used.

The light-emitting element 3 of the present embodiment has the above-described configuration. As shown in FIGS. 5(a) and 5(b), in the light-emitting element 3 of the present embodiment, the area of the light-emitting layer 10 of the diode in the edge portion is smaller than the area of the light-emitting layer 10 of the diode in the inner region located inside the edge portion. More specifically, the light-emitting layer 10 of the diode in the edge portion has an outer peripheral size of about 0.9 mm*about 0.9 mm, and the light-emitting layer 10 of the diode in the inner region located inside the edge portion has an outer peripheral size of about 0.6 mm*about 0.6 mm. Consequently, the ratio between the area of the light-emitting layer 10 of the diode in the edge portion and the area of the light-emitting layer 10 of the diode in the inner region located inside the edge portion is approximately 2:3. In other words, if the isolation groove 12 and the like are not considered, the area of the light-emitting layer 10 of the diode in the edge portion is 0.45 mm$^2$, and the area of the light-emitting layer 10 of the diode in the inner region located inside the edge portion is 0.36 mm$^2$. However, if the fact that the light-emitting layer 10 is removed in the shape of a circle having a diameter of 0.2 mm at the location of the cathode terminal 16, as well as the isolation width of each diode, is considered, the ratio is approximately 2:3. The edge portion 5a (high luminance region) of the light extraction surface 5 has a width of about 0.15 mm.

As described above, the light-emitting element 3 of the present embodiment is divided into two diodes: a diode in the edge portion and a diode in the inner region located inside the edge portion, the diode in the edge portion and the diode in the inner region located inside the edge portion are connected in series, and the area of the light-emitting layer 10 of the diode in the edge portion is smaller than that of the light-emitting layer 10 of the diode in the inner region located inside the edge portion. Thereby, the current density of the light-emitting layer 10 of the diode in the edge portion can be increased, and thus the luminance of the primary light emitted from the edge portion 5a of the light extraction surface 5 of the light-emitting element 3 will be higher than the luminance of the primary light emitted from the inner region 5b located inside the edge portion 5a.

As shown in FIG. 6, the light-emitting element 3 is mounted on the base 2 by causing the anode terminal 14 and the cathode terminal 16 to adhere to an Au/Sn adhesion layer (not shown). The Au/Sn adhesion layer is electrically connected to a Ti/Pt/Au electrode 19 disposed on the base 2. The light-emitting element 3 is covered with a wavelength converting portion 4 in a tight contact state.

The light-emitting device 1 of the present embodiment has the above-described configuration. In the present embodiment, the height of the light-emitting element 3 is about 30 micrometer, and the height of the wavelength converting portion 4 (the height from the surface of the base 2) is about 0.2 mm. Because a configuration is adopted in which the luminance of the primary light emitted from the edge portion 5a of the light extraction surface 5 of the light-emitting element 3 is made higher than the luminance of the primary light emitted from the inner region 5b located inside the edge portion 5a as described above, the light color difference across the light extraction surface 6 of the wavelength converting portion 4 that covers the light-emitting element 3 can be reduced, and it is therefore possible to irradiate the irradiation surface with light of uniform color.

In order to evaluate the color nonuniformity of the light emitted from the produced light-emitting device 1, the color temperature of light emitted with a forward current If =350 mA was measured. The measuring method will be described with reference to FIG. 7. FIG. 7 is a schematic diagram used to illustrate a method for measuring the color temperature of the light emitted from the light-emitting device. In the state where the light-emitting device 1 is caused to emit light, the color temperature of emitted light that passes through a semicircle having a radius of 1 m (indicated by the dashed line in FIG. 7) from the light-emitting device 1 serving as the center point was measured by using a detector 59 (S9219 available from Hamamatsu Photonics K.K., diameter of light-receiving surface: 11.3 mm). Then, radiation angles theta relative to the optical axis L of the light-emitting element 3 versus color temperature differences relative to a color temperature (about 3600 [K]) when theta=0 degrees were plotted. The obtained result is shown in FIG. 8.

As can be seen from FIG. 8, according to the light-emitting device 1 of the present embodiment, the color temperature difference is reduced, and as a result, the color nonuniformity can be reduced.

In the present embodiment, the light-emitting element 3 is divided into two diodes: a diode in the edge portion and a diode in the inner region located inside the edge portion, but the light-emitting element 3 may be divided into three or more diodes. According to this configuration, the luminance of primary light emitted from each region of the light extraction surface 5 of the light-emitting element 3 can be adjusted finely, and it is therefore possible to irradiate the irradiation surface with light of more uniform color. The area and current density of the light-emitting layers of the diodes that are connected in series are substantially inversely proportional to each other, and the light-emitting area and the luminance are also substantially inversely proportional to each other. It is also possible to employ a configuration in which a plurality of diodes are connected in series, a plurality of which are connected in parallel.

Embodiment 2

A light-emitting device according to Embodiment 2 of the present invention will be described next with reference to FIG. 9. FIG. 9 shows diagrams that more specifically show a light-emitting element that is used in the light-emitting device of the present embodiment. FIG. 9(a) is a cross-sectional view, and FIG. 9(b) is a plan view showing a side opposite to the light extraction surface. The basic configuration of the light-emitting device of the present embodiment is the same as that of Embodiment 1 described above (see FIGS. 1 to 3).

As shown in FIGS. 9(a) and 9(b), an n-GaN-based semiconductor layer 9, a light-emitting layer 10 and a p-GaN-based semiconductor layer 11 are laminated in this order on one principal surface of a growth substrate 7 made of GaN, SiC, sapphire or the like. The other principal surface of the growth substrate 7 is processed to have an uneven structure.

An isolation groove 20 for separating a light-emitting element 3 into a portion corresponding to the edge portion 5a of the light extraction surface 5 and a portion corresponding to the inner region 5b located inside the edge portion 5a is provided such that the isolation groove 20 spans across the p-GaN-based semiconductor layer 11, the light-emitting layer 10, and part of the n-GaN-based semiconductor layer 9. Thereby, the light-emitting element 3 is divided into two diodes: a diode in the edge portion and a diode in the inner region located inside the edge portion.

Rh/Pt/Au electrodes 13a and 13b that are highly reflective electrodes are provided as an anode electrode on the p-GaN-based semiconductor layer 11 at the edge portion and the inner region located inside the edge portion, and the Rh/Pt/Au electrode 13a of the edge portion and the Rh/Pt/Au electrode 13b of the inner region located inside the edge portion are electrically connected to anode terminals 14a and 14b, respectively. A Ti/Au electrode 15 serving as a cathode electrode is provided in the n-GaN-based semiconductor layer 9 at the inner region located inside the edge portion, and the Ti/Au electrode 15 is electrically connected to a cathode terminal 16. An insulating layer 18 made of silicon nitride is interposed inside the isolation groove 20, and between the anode terminals 14a, 14b and cathode terminal 16, and the n-GaN-based semiconductor layer 9, light-emitting layer 10 and p-GaN-based semiconductor layer 11.

The light-emitting element 3 of the present embodiment has the above-described configuration, and the diode in the edge portion and the diode in the inner region located inside the edge portion are configured such that they can be driven electrically independently of each other.

As described above, the light-emitting element 3 of the present embodiment is divided into two diodes: a diode in the edge portion and a diode in the inner region located inside the edge portion, and the diode in the edge portion and the diode in the inner region located inside the edge portion are configured such that they can be driven electrically independently of each other. Therefore, a current can be injected such that the luminance of the primary light emitted from the edge portion 5a of the light extraction surface 5 of the light-emitting element 3 is higher than the luminance of the primary light emitted from the inner region 5b located inside the edge portion 5a. For example, as shown in FIG. 9(b), the diode D3 of the edge portion to which a variable resistor R1 is connected in series is connected in parallel with the diode D4 of the inner region located inside the edge portion to which a variable resistor R2 is connected in series, and by adjusting the resistance values of the variable resistors R1 and R2, a current can be injected such that the luminance of the primary light emitted from the edge portion 5a of the light extraction surface 5 is higher than the luminance of the primary light emitted from the inner region 5b located inside the edge portion 5a. With this configuration, balance adjustment can be performed by separately adjusting the amount of current injected into the diode in the edge portion and the amount of current injected into the diode in the inner region located inside the edge portion.

The current densities of the diodes D3 and D4 can be changed as well by changing the resistance component of the light-emitting element 3, instead of changing the resistance values of the variable resistors R1 and R2 provided outside the light-emitting element 3. For example, if the area of the light-emitting layer of each diode is changed, the internal resistance value of the diode having a larger area decreases relatively, causing a large current to flow therethrough, and increasing the current density. The internal resistance value can be changed also by other methods such as selecting materials for the wiring and the electrodes of the light-emitting element 3 as appropriate, and changing the doping amount doped into the semiconductor layer. By changing the current density using the internal resistance value, the power source configuration of the light-emitting element 3 can be simplified.

Similarly to the case of Embodiment 1 described above, the light-emitting element 3 of the present invention also is mounted on the base 2, and is covered tightly with a wavelength converting portion 4 to form a light-emitting device (see FIG. 6). Because a configuration is adopted in which the luminance of the primary light emitted from the edge portion 5a of the light extraction surface 5 of the light-emitting element 3 is made higher than the luminance of the primary light emitted from the inner region 5b located inside the edge portion 5a as described above, the light color difference across the light extraction surface 6 (see FIG. 6) of the wavelength converting portion 4 that covers the light-emitting element 3 can be reduced, and it is therefore possible to irradiate the irradiation surface with light of uniform color.

In the present embodiment, the light-emitting element 3 is divided into two diodes: a diode in the edge portion and a diode in the inner region located inside the edge portion, but the light-emitting element 3 may be divided into three or more diodes. According to this configuration, the luminance of primary light emitted from each region of the light extraction surface 5 of the light-emitting element 3 can be adjusted finely, and it is therefore possible to irradiate the irradiation surface with light of more uniform color.

Embodiment 3

A light-emitting device according to Embodiment 3 of the present invention will be described next with reference to FIGS. 10 and 11. FIG. 10 shows diagrams that more specifically show a light-emitting element that is used in the light-emitting device of the present embodiment. FIG. 10(a) is a cross-sectional view, and FIG. 10(b) is a plan view showing a light extraction surface. FIG. 11 is a cross-sectional view that more specifically shows the light-emitting device of the present embodiment. The basic configuration of the light-emitting device of the present embodiment is the same as that of Embodiment 1 described above (see FIGS. 1 to 3).

As shown in FIGS. 10(a) and 10(b), a light-emitting element 3 of the present embodiment is formed on one principal surface of a base 21 made of a conductive material such as GaN or SiC. A Rh/Pt/Au electrode 23 which is a highly reflective electrode is provided as an anode electrode on the principal surface of the base 21 with an Au/Sn adhesion layer 22 interposed therebetween. On the Rh/Pt/Au electrode 23, a laminate in which a p-GaN-based semiconductor layer 11, a light-emitting layer 10 and an n-GaN-based semiconductor layer 9 are laminated in this order is provided. The light extraction surface 5 of the n-GaN-based semiconductor layer 9 is processed to have an uneven structure. Thereby, the light extraction efficiency of the light-emitting device can be improved. An anode terminal 24 is provided on the other principal surface of the base 21. A Ti/Au electrode 25 serving as a cathode electrode is provided only in the edge portion of the n-GaN-based semiconductor layer 9, and the Ti/Au electrode 25 is connected electrically to a cathode terminal 26. An insulating layer 28 made of silicon nitride is interposed between the cathode terminal 26 and the n-GaN-based semiconductor layer 9, light-emitting layer 10, p-GaN-based semiconductor layer 11 and base 21.

The growth substrate (not shown) of the light-emitting element 3 is removed after it is bonded to the base 21 with a bonding material, such as an Au/Sn adhesion layer 22, interposed therebetween, whereby the light-emitting element 3 is obtained. The growth substrate can be removed by the laser lift-off technique, polishing, etching technique or the like, which are a common technique.

The light-emitting element 3 of the present embodiment has the above-described configuration.

As described above, in the light-emitting element 3 of the present embodiment, the Ti/Au electrode 25 serving as a cathode electrode is provided only on the edge portion. Thereby, the current density of the edge portion can be increased, and it is therefore possible to make the luminance of the primary light emitted from the edge portion 5a of the light extraction surface 5 of the light-emitting element 3 higher than the luminance of the primary light emitted from the inner region 5b located inside the edge portion 5a.

As shown in FIG. 11, the light-emitting element 3 formed on the base 21 is covered tightly with the wavelength converting portion 4. In the present embodiment, the height of the light-emitting element 3 (the height from the upper surface of the insulating layer 28) is about 3 micrometer, and the height of the wavelength converting portion 4 (the height from the upper surface of the cathode terminal 26) is about 0.1 mm. Because a configuration is adopted in which the luminance of the primary light emitted from the edge portion 5a of the light extraction surface 5 of the light-emitting element 3 is made higher than the luminance of the primary light emitted from the inner region 5b located inside the edge portion 5a as described above, the light color difference across the light extraction surface 6 of the wavelength converting portion 4 that covers the light-emitting element 3 can be reduced, and it is therefore possible to irradiate the irradiation surface with light of uniform color.

In the present embodiment, the cathode electrode is provided only on the edge portion, but the present invention is not necessarily limited to this configuration, and it is sufficient that at least one of the cathode electrode and the anode electrode is provided only on the edge portion.

Embodiment 4

A light-emitting device according to Embodiment 4 of the present invention will be described next with reference to FIGS. 12 and 13. FIG. 12 shows diagrams that specifically show an example of a light-emitting element that is used in a light-emitting device according to the present embodiment. FIG. 12(a) is a cross-sectional view, and FIG. 12(b) is a plan view showing a light extraction surface. FIG. 13 shows diagrams that specifically show another example of the light-emitting element that is used in the light-emitting device according to the present embodiment. FIG. 13(a) is a cross-sectional view, and FIG. 13(b) is a plan view showing a light extraction surface. The basic configuration of the light-emitting device of the present embodiment is the same as that of Embodiment 1 described above (see FIGS. 1 to 3).

The light-emitting element 3 of the present embodiment has the same configuration as that of the light-emitting element 3 of Embodiment 3 described above (see FIG. 10), except that the configuration of the cathode electrode is different. Accordingly, only the configuration of the cathode electrode will be described in the present embodiment. Furthermore, constituent members that are the same as those of the light-emitting element 3 of Embodiment 3 described above are given the same reference numerals, and descriptions thereof are omitted here.

As shown in FIGS. 12(a) and 12(b), a Ti/Au electrode 25 serving as a cathode electrode is provided on the upper surface of an n-GaN-based semiconductor layer 9, and the Ti/Au electrode 25 is electrically connected to a cathode terminal 26.

The Ti/Au electrode 25 is provided in the form of a grid of squares over the edge portion and the inner region located inside the edge portion. In this case, the electrode spacing L1 of the Ti/Au electrode 25 of the edge portion is smaller than the electrode spacing L2 of the Ti/Au electrode 25 of the inner region located inside the edge portion.

The light-emitting element 3 of the present embodiment has the above-described configuration.

As described above, in the light-emitting element 3 of the present embodiment, for the Ti/Au electrode 25 serving as a cathode electrode, the electrode spacing L1 in the edge portion is made smaller than the electrode spacing L2 in the inner region located inside the edge portion, whereby the current density of the edge portion can be increased, and it is therefore possible to make the luminance of the primary light emitted from the edge portion 5a of the light extraction surface 5 of the light-emitting element 3 higher than the luminance of the primary light emitted from the inner region 5b located inside the edge portion 5a. As a result, similar to the case of Embodiment 3, the light color difference across the light extraction surface 6 (see FIG. 11) of the wavelength converting portion 4 that covers the light-emitting element 3 can be reduced, and it is therefore possible to irradiate the irradiation surface with light of uniform color.

Also in the light-emitting element 3 shown in FIGS. 13(a) and 13(b), a Ti/Au electrode 25 serving as a cathode electrode is provided on the upper surface of an n-GaN-based semiconductor layer 9, and the Ti/Au electrode 25 is connected electrically to a cathode terminal 26.

The Ti/Au electrode 25 is provided in a hexagonal spider web-like pattern over the edge portion and the inner region located inside the edge portion. In this case, the electrode spacing L3 of the Ti/Au electrode 25 of the edge portion is smaller than the electrode spacing L4 of the Ti/Au electrode 25 of the inner region located inside the edge portion. Accordingly, similar to the above-described case, in this case also, it is possible to irradiate the irradiation surface with light of uniform color.

In the present embodiment, only for the cathode electrode, the electrode spacing in the edge portion is made smaller than the electrode spacing in the inner region located inside the edge portion, but the present invention is not necessarily limited to this configuration, and it is sufficient that for at least one of the cathode electrode and the anode electrode, the electrode spacing in the edge portion is made smaller than the electrode spacing in the inner region located inside the edge portion.

Embodiment 5

A light-emitting device according to Embodiment 5 of the present invention will be described next with reference to FIG. 14. FIG. 14 shows diagrams that specifically show an example of a light-emitting element that is used in the light-emitting device of the present embodiment. FIG. 14(a) is a cross-sectional view, and FIG. 14(b) is a plan view showing a light extraction surface. The basic configuration of the light-emitting device of the present embodiment is the same as that of Embodiment 1 described above (see FIGS. 1 to 3).

A light-emitting element 3 of the present embodiment has the same configuration as that of the light-emitting element 3 of Embodiment 3 described above (see FIG. 10), except that the configuration of the cathode electrode is different. Accordingly, only the configuration of the cathode electrode will be described in the present embodiment. Furthermore, constituent members that are the same as those of the light-emitting element 3 of Embodiment 3 described above are given the same reference numerals, and descriptions thereof are omitted here.

As shown in FIGS. 14(a) and 14(b), on the upper surface of an n-GaN-based semiconductor layer 9, an ITO electrode 29 that has a concave-convex shape similar to the concave-convex shape of the n-GaN-based semiconductor layer 9 and serves as a cathode electrode is provided, and the ITO electrode 29 is electrically connected to a cathode terminal 26.

The ITO electrode 29 is formed such that the edge portion has a thickness greater than the thickness of the inner region located inside the edge portion.

The light-emitting element 3 of the present embodiment has the above-described configuration.

As described above, in the light-emitting element 3 of the present embodiment, the ITO electrode 29 serving as a cathode electrode is formed such that the edge portion has a thickness greater than the thickness of the inner region located inside the edge portion, whereby the electrode resistance of the edge portion of the ITO electrode 29 can be made smaller than the electrode resistance of the inner region located inside the edge portion. As a result, the current density of the edge portion can be increased, and thus the luminance of the primary light emitted from the edge portion 5a of the light extraction surface 5 of the light-emitting device 3 can be made higher than the luminance of the primary light emitted from the inner region 5b located inside the edge portion 5a. With this, similar to the case of Embodiment 3, the light color difference across the light extraction surface 6 (see FIG. 11) of the wavelength converting portion 4 that covers the light-emitting element 3 can be reduced, and it is therefore possible to irradiate the irradiation surface with light of uniform color.

In the present embodiment, only for the cathode electrode, the electrode resistance of the edge portion is made smaller than the electrode resistance of the inner region located inside the edge portion, but the present invention is not necessarily limited to this configuration, and it is sufficient that for at least one of the cathode electrode and the anode electrode, the electrode resistance of the edge portion is made smaller than the electrode resistance of the inner region located inside the edge portion.

Embodiment 6

A light-emitting device according to Embodiment 6 of the present invention will be described next with reference to FIG. 15. FIG. 15 shows diagrams that specifically show a light-emitting element that is used in the light-emitting device of the present embodiment. FIG. 15(a) is a cross-sectional view, and FIG. 15(b) is a plan view showing a light extraction surface. The basic configuration of the light-emitting device of the present embodiment is the same as that of Embodiment 1 described above (see FIGS. 1 to 3).

As shown in FIGS. 15(a) and 15(b), a light-emitting element 3 of the present embodiment is formed on one principal surface of a base 30 made of sapphire. An anode terminal 24 is provided on the principal surface of the base 30. A Rh/Pt/Au electrode 23, which is a highly reflective electrode, is provided as an anode electrode on the anode terminal 24 with an Au/Sn adhesion layer 22 interposed therebetween. On the Rh/Pt/Au electrode 23, a laminate in which a p-GaN-based semiconductor layer 11, a light-emitting layer 10 and an n-GaN-based semiconductor layer 9 are laminated in this order is provided. The light extraction surface 5 of the n-GaN-based semiconductor layer 9 is processed to have an uneven structure.

A Ti/Au electrode 25 serving as a cathode electrode is provided only in the edge portion of the n-GaN-based semiconductor layer 9, and the Ti/Au electrode 25 is connected electrically to a cathode terminal 26. An insulating layer 28 made of silicon nitride is interposed between the cathode terminal 26 and the n-GaN-based semiconductor layer 9, light-emitting layer 10, p-GaN-based semiconductor layer 11 and anode terminal 24.

In the n-GaN-based semiconductor layer 9 or the p-GaN-based semiconductor layer 11 of the light-emitting element 3, the inner region located inside the edge portion is formed into a high resistance region by, for example, Zn ion implantation, and the edge portion is formed into a low resistance region by doping the edge portion with a dopant agent at a high concentration, for example, in the case of the n-GaN-based semiconductor layer, it is doped with Si, and in the case of the p-GaN-based semiconductor layer, it is doped with Mg. In other words, in the light-emitting element 3, the internal resistance of the inner region located inside the edge portion is greater than the internal resistance of the edge portion.

The light-emitting element 3 of the present embodiment has the above-described configuration.

As described above, in the light-emitting element 3 of the present embodiment, the internal resistance of the inner region located inside the edge portion is made greater than the internal resistance of the edge portion, whereby the current density of the edge portion can be increased, and it is therefore possible to make the luminance of the primary light emitted from the edge portion 5a of the light extraction surface 5 of the light-emitting element 3 higher than the luminance of the primary light emitted from the inner region 5b located inside the edge portion 5a. As a result, similar to the case of Embodiment 3 described above, the light color difference across the light extraction surface 6 (see FIG. 11) of the wavelength converting portion 4 that covers the light-emitting element 3 can be reduced, and it is therefore possible to irradiate the irradiation surface with light of uniform color.

In the present embodiment, methods such as ion implantation and high concentration doping are employed to make the internal resistance of the inner region located inside the edge portion greater than the internal resistance of the edge portion, but the present invention is not limited to these methods.

Embodiment 7

A light-emitting device according to Embodiment 6 of the present invention will be described next with reference to FIGS. 16 and 17. FIG. 16 shows diagrams that specifically show an example of a light-emitting element that is used in the light-emitting device of the present embodiment. FIG. 16(a)

is a cross-sectional view, and FIG. 16(b) is a plan view showing a light extraction surface. FIG. 17 shows diagrams that specifically show another example of the light-emitting element that is used in the light-emitting device of the present embodiment. FIG. 17(a) is a cross-sectional view, and FIG. 17(b) is a plan view showing a light extraction surface. The basic configuration of the light-emitting device of the present embodiment is the same as that of Embodiment 1 described above (see FIGS. 1 to 3).

The light-emitting element 3 of the present embodiment has the same configuration as that of the light-emitting element 3 of Embodiment 3 described above (see FIG. 10), except that only the configuration of the n-GaN-based semiconductor layer and the cathode electrode, or the configuration of the n-GaN-based semiconductor layer is different. Accordingly, only the configuration of the n-GaN-based semiconductor layer and the cathode electrode, or the configuration of the n-GaN-based semiconductor layer will be described in the present embodiment. Furthermore, constituent members that are the same as those of the light-emitting element 3 of Embodiment 3 described above are given the same reference numerals, and descriptions thereof are omitted here.

As shown in FIGS. 16(a) and 16(b), the light extraction surface 5 of an n-GaN-based semiconductor layer 31 is processed to be flat, and a flat plate-like cathode electrode 32 is provided on the upper surface of the n-GaN-based semiconductor layer 31. The cathode electrode 32 is connected electrically to a cathode terminal 26.

The edge portion of the cathode electrode 32 is configured of a dielectric multilayer film in which thin films made of metal oxides such as $SiO_2$, ZnO, $TiO_2$, $Ta_2O_3$, $Nb_2O_5$ and ZnS are periodically laminated. Accordingly, the edge portion of the cathode electrode 32 is a high transmissivity region. In other words, in the light-emitting element 3, the transmissivity of the primary light emitted from the edge portion is greater than the transmissivity of the primary light emitted from the inner region located inside the edge portion.

The light-emitting element 3 of the present embodiment has the above-described configuration.

As described above, in the light-emitting element 3 of the present embodiment, the transmissivity of the primary light emitted from the edge portion is made higher than the transmissivity of the primary light emitted from the inner region located inside the edge portion, whereby the luminance of the primary light emitted from the edge portion 5a of the light extraction surface 5 of the light-emitting element 3 can be made higher than the luminance of the primary light emitted from the inner region 5b located inside the edge portion 5a. As a result, similar to the case of Embodiment 3, the light color difference across the light extraction surface 6 (see FIG. 11) of the wavelength converting portion 4 that covers the light-emitting element 3 can be reduced, and it is therefore possible to irradiate the irradiation surface with light of uniform color.

In a light-emitting element 3 shown in FIGS. 17(a) and 17(b), only the edge portion of the light extraction surface 5 of an n-GaN-based semiconductor layer 33 is processed to have an uneven structure. Accordingly, the edge portion of the n-GaN-based semiconductor layer 33 is a high transmissivity region. Therefore, similar to the above, the luminance of the primary light emitted from the edge portion 5a of the light extraction surface 5 of the light-emitting element 3 can be made higher than the luminance of the primary light emitted from the inner region 5b located inside the edge portion 5a.

Embodiment 8

A light-emitting device according to Embodiment 8 of the present invention will be described next with reference to FIG. 18. FIG. 18 is a schematic cross-sectional view showing an example of a light-emitting device according to Embodiment 8 of the present invention.

As shown in FIG. 18, a light-emitting device 34 of the present embodiment includes a base 35 having a recess, and a single light-emitting element 36 that is disposed at the bottom of the recess (on the base 35). In the present embodiment, the bottom and inner wall surface of the recess are light reflecting, so that light (primary light) emitted from the light-emitting element 36 can be reflected toward the opening of the recess. The inner wall surface of the recess is flared toward the opening of the recess. This improves the light extraction efficiency of the light-emitting device 34.

There is no particular limitation on the material for constituting the base 35, and it is possible to use, for example, monocrystals such as sapphire Si, GaN, AlN, ZnO, SiC, BN and ZnS; ceramics such as $Al_2O_3$, AlN, BN, MgO, ZnO, SiC and C, and mixtures thereof; metals such as Al, Cu, Fe, Au and W, and alloys that include these metals; glass epoxy; resins such as epoxy resin, silicone resin, acrylic resin, urea resin, amide resin, imide resin, polycarbonate resin, polyphenyl sulfide resin, liquid crystal polymer, acrylonitrile-butadiene-styrene resin (ABS resin), methacrylate resin (PMMA resin) and cyclic olefin copolymer, and mixtures thereof.

Also, there is no particular limitation on the configuration and mounting method of the light-emitting element 36. Examples of the configuration of the base include a lead frame base, a package base in which a light-emitting element is mounted, and a submount base that is interposed between a light-emitting element and a package base.

The light-emitting element 36 is a light-emitting element that emits light that is absorbed by a wavelength converting material. As the light-emitting element, it is possible to use, for example, a green LED that emits green light having a wavelength of 500 to 550 nm, a blue LED that emits blue light having a wavelength of 420 to 500 nm, a blue-violet LED that emits blue-violet light having a wavelength of 380 to 420 nm, and an ultraviolet LED having an even shorter wavelength. In the case of a nitride semiconductor material, it is represented by a general formula: $B_zAl_xGa_{1-x-y-z}In_yN$ (where x is in the range of 0 to 1, y is in the range of 0 to 1, z is in the range of 0 to 1, and x+y+z is in the range of 0 to 1). Hereinafter, this is referred to as "GaN-based semiconductor". It is also possible to use a II-VI group semiconductor material such as ZnS or ZnO.

The light-emitting element is not limited to those made of a compound semiconductor material, and it is also possible to use light-emitting elements made of an organic semiconductor material or an inorganic semiconductor material.

As the method for mounting the light-emitting element 36, for example, a method as shown in enlarged cross-sectional views of FIGS. 19(a) to 19(c) can be used.

In the example shown in FIG. 19(a), a Ni/Au electrode 45 that serves as an anode electrode provided on a p-GaN-based semiconductor layer 36a which is a p-type semiconductor layer is wire-bonded to metal wiring 42 formed on a base 35 by an Au wire 48. In the example shown in FIG. 19(a), an n-SiC substrate 36d can be used as the substrate of the light-emitting element 36, and an n-GaN layer 36c that is disposed on the n-SiC substrate 36d and serves as an n-type semiconductor layer is electrically connected to a Ni/Ag/Pt/Au electrode 49 serving as a cathode electrode with the n-SiC substrate 36d interposed therebetween. In other words, the n-SiC substrate 36d is connected electrically to the metal wiring 42 via the Ni/Ag/Pt/Au electrode 49 which is a highly reflective electrode. In FIG. 19(a), reference numeral 36b denotes a light-emitting layer.

In the example shown in FIG. 19(b), the light-emitting element 36 is configured by sequentially laminating, from the side of the metal wiring 42, a p-GaN-based semiconductor layer 36a as a p-type semiconductor layer, a GaN-based semiconductor light-emitting layer 36b, an n-GaN-based semiconductor layer 36c as an n-type semiconductor layer, and a sapphire substrate 36e. A Rh/Pt/Au electrode 44, which is a highly reflective electrode, is provided as an anode electrode on the p-GaN-based semiconductor layer 36a, and the Rh/Pt/Au electrode 44 is bonded to bumps 43. A Ni/Au electrode 45 is provided as a cathode electrode on a portion of the n-GaN-based semiconductor layer 36c, and the Ni/Au electrode 45 also is bonded to a bump 43. Thereby, the light-emitting element 36 is flip-chip mounted onto the metal wiring 42 formed on the base 35 with the bumps 43 therebetween.

In the example shown in FIG. 19(c), the light-emitting element 36 is mounted on the base 35 by attaching the Rh/Pt/Au terminal 44 serving as an anode electrode to the base 35 with an Au/Sn adhesion layer 55. The Au/Sn adhesion layer 55 is connected electrically to a Ti/Pt/Au electrode 50 disposed on the base 35. The n-GaN layer 36c is connected electrically to a metal wiring 51 formed on the base 35 with a Ti/Au electrode 46 serving as a cathode electrode interposed therebetween. A surface of the n-GaN layer 36c is processed to have an uneven structure. Thereby, the light extraction efficiency of the light-emitting device 34 can be improved. A silicon nitride film 47 serving as an insulating layer is interposed between the side face of the light-emitting element 3 and the Ti/Au electrode 46.

As shown in FIG. 18, in the light-emitting device 34 of the present embodiment, the light-emitting element 36 is covered tightly with a first cover portion 37, and the side face of the first cover portion 37 is surrounded tightly by a second cover portion 38. Here, the first and second cover portions 37 and 38 are formed such that their upper surfaces are flush with each other. Furthermore, the first and second cover portions 37 and 38 are covered tightly with a plate-like wavelength converting portion 39. The wavelength converting portion 39 has a uniform thickness, and a wavelength converting material constituting the wavelength converting portion 39 is distributed uniformly. The upper surface of the wavelength converting portion 39 is flush with the surface of the base 35 in which there is an opening of the recess. And, light (primary light) emitted from the light-emitting element and secondary light obtained through absorption and conversion of the primary light by the wavelength converting material are mixed in the wavelength converting portion 39, and this mixed light is emitted from the upper surface of the wavelength converting portion 39.

The refractive index of the second cover portion 38 is set higher than the refractive index of the first cover portion 37. In other words, in the light-emitting device 34 of the present embodiment, the cover portion (the second cover portion 38) in the outer periphery of the wavelength converting portion 39 has a refractive index higher than that of the other portion of the cover portion (the first cover portion 37). As the distance from the light-emitting element 36 to the interface between the first cover portion 37 and the second cover portion 38 becomes shorter, the effect of the present invention to achieve a thin light-emitting device with less color nonuniformity can be attained by shortening the distance between the light-emitting element and the wavelength converting portion. As the yardstick, it is sufficient to make the distance between the interface between the first cover portion 37 and the second cover portion 38 and the periphery of the light-emitting element 36 smaller than the distance between the light-emitting element 36 and the wavelength converting portion 39. It is preferable that the distance between the interface between the first cover portion 37 and the second cover portion 38 and the periphery of the light-emitting element 36 is 1 mm or less, preferably 0.5 mm or less, and more preferably 0.2 mm or less. As will be described later, the interface may be in contact with the light-emitting element.

According to the light-emitting device 34 of the present embodiment, the refractive index ($n_2$) of the cover portion (the second cover portion 38) in the outer periphery of the wavelength converting portion 39 is set higher than the refractive index ($n_1$) of the other portion (the first cover portion 37) of the cover portion, whereby light (primary light) emitted from the light-emitting element 36 can be caused to enter uniformly the wavelength converting portion 39. Particularly when the refractive index ratio ($n_1/n_2$) is 0.9 or less, light (primary light) emitted from the light-emitting element 36 can be caused to enter sufficiently uniformly the wavelength converting portion 39.

Ordinarily, the light intensity of light (primary light) emitted from a light-emitting element is high in the substantially vertically upward direction, and is smaller as it moves in the lateral direction. However, according to the configuration of the light-emitting device 34 of the present embodiment, as described in the foregoing, light (primary light) emitted from the light-emitting element 36 can be caused to enter the wavelength converting portion 39 uniformly, and thus the primary light can be caused to enter the wavelength converting portion 39 having a uniform thickness and a uniform distribution of a wavelength converting material at a uniform intensity from the undersurface of the wavelength converting portion 39. Consequently, uniformly mixed light can be emitted from the upper surface of the wavelength converting portion 39, and it is therefore possible to reduce the color nonuniformity of light extracted from the light-emitting device 34. In other words, the light-emitting device 34 of the present embodiment includes a primary light intensity distribution control means for setting the intensity distribution of the primary light within the wavelength converting portion 39 such that the mixing ratio of the primary light and the secondary light that are emitted from the light extraction surface of the wavelength converting portion 39 is substantially uniform.

By adopting a configuration as that of the light-emitting device 34 of the present embodiment, primary light can be caused to enter at a uniform intensity from the undersurface of the wavelength converting portion without increasing the distance between the light-emitting element and the wavelength converting portion, and thus even in a thin LED, uniformly mixed light can be emitted from the upper surface of the wavelength converting portion.

In order to control the refractive indexes of the first and second cover portions 37 and 38 as described above, for example, it is sufficient to select materials constituting the first and second cover portions 37 and 38 such that the refractive indexes of the cover portions 37 and 38 satisfy the above-described relationship.

There is no particular limitation on the materials constituting the first and second cover portions 37 and 38. Various materials can be used as long as at least part of the light emitted from the light-emitting element 3 can pass through the first and second cover portions 37 and 38. For example, it is possible to use metal oxides such as aluminum oxide (refractive index: 1.63), cerium oxide (refractive index: 2.2), hafnium oxide (refractive index: 1.95), magnesium oxide (refractive index: 1.74), niobium oxide (refractive index: 2.33), tantalum oxide (refractive index: 2.16), zirconium oxide (refractive index: 2.05), zinc oxide (refractive index: 2.1), titanium oxide (refractive index: 2.4), yttrium oxide (refractive index: 1.87), silicon oxide (refractive index: 1.5), indium oxide (refractive index: 2), tin oxide (refractive index: 2), tungsten oxide (refractive index: 2.2) and vanadium oxide (refractive index: 2.0); inorganic materials such as silicon nitride (refractive index: 1.9), gallium nitride (refractive index: 2.5), silicon carbide (refractive index: 2.6), calcium fluoride (refractive index: 1.43), calcium carbonate (refractive index: 1.58), barium sulfate (refractive index: 1.64), copper sulfide (refractive index: 2.1), tin sulfide (refractive index: 2.0) and zinc sulfide (refractive index: 2.37); diamond (refractive index: 2.4); and mixtures thereof. The refractive index values within parentheses indicate the refractive index of the respective materials with respect to light having a wavelength of 550 nm.

As the method for forming the first and second cover portions 37 and 38 using the above-listed materials, for example, sol-gel method can be used. For example, when forming a cover portion made of silicon oxide by sol-gel method, metal alkoxide (methylsilicate, N-butyl silicate, etc.) is hydrolyzed to form a sol. After that, the viscosity of the resulting sol is adjusted to a predetermined value using an alcohol such as ethylene glycol. The resultant is applied onto desired locations on a base, dried at 200 degrees C. for several tens of minutes, and then heated at 300 degrees C. for about two hours. Thereby, a cover portion made of silicon oxide is obtained. When forming a cover portion using a metal oxide other than silicon oxide such as titanium oxide, the same method can be used. When forming a cover portion by sol-gel method, a nanoparticle material described later can be used in combination. For example, a nanoparticle material is dispersed in a metal alkoxide to form a gel, whereby a cover portion made of a metal oxide and a nanoparticle material is obtained. As a method for adjusting the refractive index, by adopting a method in which the mixing ratio of at least two of the above-listed materials having different refractive indexes is changed, adjustment can be effected between the refractive indexes of the materials. In other words, the refractive index of the cover portion can be increased by selecting a material having a high refractive index, or increasing the mixing ratio of the material.

As the materials constituting the first and second cover portions 37 and 38, resins such as epoxy resin, silicone resin, acrylic resin, urea resin, amide resin, imide resin, polycarbonate resin, polyphenyl sulfide resin, liquid crystal polymer, ABS resin, PMMA resin and cyclic olefin copolymer; resins made of a mixture thereof; or glass such as low melting point glass may be used. When using a light-transmitting material such as these resins or glass, the refractive index of the light-transmitting material can be increased by irradiating an electron beam or ion beam (hydrogen ion beam, helium ion beam or the like) to the light-transmitting material. It is also possible to use a composite material obtained by dispersing a nanoparticle material made of a metal oxide or inorganic material listed above in the light-transmitting material serving as a base material. In this case, the refractive index of the cover portion can be adjusted by adjusting the amount of the nanoparticle material that is dispersed in the base material. When a curable resin is used as the base material, the thixotropy of the curable resin before being cured can be improved by dispersing the nanoparticle material in the curable resin in an uncured state, so that the cover portion can be easily formed into a desired shape. Furthermore, because the heat conductivity is improved as compared to the case of using a resin alone, heat from the light-emitting element 3 can be dissipated with high efficiency.

As the materials constituting the first and second cover portions 37 and 38, a composite material obtained by dispersing a nanoparticle material in the light-transmitting material serving as a base material may be used. As the nanoparticle material, for example, ultrafine particles made of a metal oxide, inorganic material listed above or the like can be used, and it is preferable to use ultrafine particles having an average particle size equal to or less than one forth of the luminous wavelength within the light-transmitting material which is a material constituting the cover portion. This is because a cover portion having sufficient transparency can be obtained as long as the nanoparticle material has an average particle size within that range. "Average particle size" used above may be an average value (e.g., the average value of the particle sizes of 100 primary particles) of the particle sizes of primary particles that are observed from an image obtained by a scanning electron microscope. Particularly, it is sufficient that the average particle size is 1 nm or more and 100 nm or less, preferably 1 nm or more and 50 nm or less. From the viewpoint of dispersibility, 1 nm or more and 10 nm or less is more preferable. As a method for adjusting the refractive index, by adopting a method in which the mixing ratio of the light-transmitting material serving as a base material and a nanoparticle material as described above having a refractive index different from that of the base material is changed, adjustment can be effected between the refractive indexes of the materials. In other words, the refractive index of the cover portion can be increased by selecting a material having a high refractive index, or increasing the mixing ratio of the material.

The wavelength converting portion 6 is made of, for example, a wavelength converting material and a light-transmitting material serving as a base material for dispersing the wavelength converting material.

As the wavelength converting material, for example, a fluorescent material can be used. As the fluorescent material, it is possible to use, for example, a red fluorescent material that emits red light, an orange fluorescent material that emits orange light, a yellow fluorescent material that emits yellow light, a green fluorescent material that emits green light, and so on. As the red fluorescent material, it is possible to use, for example, silicate-based material such as $Ba_3MgSi_2O_8:Eu^{2+}$, $Mn^{2+}$, a nitridosilicate-based material such as $Sr_2Si_5N_8:Eu^{2+}$, a nitridoaluminosilicate-based material such as $CaAlSiN_3:Eu^{2+}$, an oxonitridoaluminosilicate-based material such as $Sr_2Si_4AlON_7:Eu^{2+}$, a sulfide-based material such as $(Sr,Ca)S:Eu^{2+}$, $La_2O_2S:Eu^{3+}$, and so on. As the orange fluorescent material, it is possible to use, for example, a silicate-based material such as $(Sr, Ca)_2SiO_4:Eu^{2+}$, a garnet-based material such as $Gd_3Al_5O_{12}:Ce^{3+}$, a Ca-alpha-sialon-based material such as Ca-alpha-SiAlON:$Eu^{2+}$, and so on. As the yellow fluorescent material, it is possible to use, for example, a silicate-based material such as $(Sr, Ca)_2SiO_4:Eu^{2+}$, a garnet-based material such as $(Y,Gd)_3Al_5O_{12}:Ce^{3+}$, a sulfide-based material such as $CaGa_2S_4:Eu^{2+}$, a Ca-alpha-sialon-based material such as Ca-alpha-SiAlON:$Eu^{2+}$, and so on. As the green fluorescent material, it is possible to use, for example, an aluminate-based material such as $BaMgAl_{10}O_{17}:Eu^{2+}$, $Mn^{2+}$ or $(Ba, Sr, Ca)Al_2O_4:Eu^{2+}$, a silicate-based material such as $(Ba, Sr)_2SiO_4:Eu^{2+}$, a Ca-alpha-sialon-based material such as Ca-alpha-SiAlON:$Yb^{2+}$, a beta-sialon-based material such as beta-$Si_3N_4:Eu^{2+}$, an oxonitridoaluminosilicate-based material such as $(Ba, Sr, Ca)_2Si_4AlON_7:Ce^{3+}$, a sulfide-based material such as $SrGa_2S_4:Eu^{2+}$, a garnet-based material such as $Y_3(Al,Ga)_5O_{12}:Ce^{3+}$, $Y_3Al_5O_{12}:Ce^{3+}$, $Ca_3Sr_2Si_3O_{12}:Ce^{3+}$ or $BaY_2 SiAl_4O_{12}:Ce^{3+}$, an oxide-based material such as $CaSc_2O_4:Ce^{3+}$, and so on. The light emitted from the upper surface of the wavelength converting portion is not limited to white light, and fine light color designs are possible by selecting these fluorescent materials as appropriate. And infinite variations are possible by using a plurality of different types of fluorescent materials having different luminous wavelengths. Besides the configuration in which the wavelength converting material is dispersed uniformly in the wavelength converting portion, the wavelength converting portion can have, for example, a configuration in which the concentration of the wavelength converting material is changed from the undersurface of the wavelength converting portion substantially gradually toward the upper surface thereof, a configuration in which layers made of different wavelength converting materials are laminated, a configuration in which cells made of different wavelength converting materials are arranged in a matrix form, or the like. With any of the above-described configurations, uniformly mixed light can be emitted from the upper surface of the wavelength converting portion by causing primary light to enter from the undersurface of the wavelength converting portion at a uniform intensity.

As the light-transmitting material, any material can be used as long as it allows the light extracted from the light-emitting device 1 to pass therethrough. Examples thereof include resins such as epoxy resin, silicone resin, acrylic resin, urea resin, amide resin, imide resin, polycarbonate resin, polyphenyl sulfide resin, liquid crystal polymer, ABS resin, PMMA resin and cyclic olefin copolymer; resins made of a mixture thereof; and glass such as low melting point glass. It is also possible to use a composite material obtained by dispersing metal oxide particles in the light-transmitting material serving as a base material. In this case, the refractive index of the wavelength converting portion 6 can be adjusted by adjusting the amount of the metal oxide particles that are dispersed in the base material. When a curable resin is used as the base material, the thixotropy of the curable resin before being cured can be improved by dispersing the metal oxide particles in the curable resin in an uncured state, so that the wavelength converting portion 6 can be easily formed into a desired shape. Furthermore, because the heat conductivity is improved as compared to the case of using a resin alone, heat from the light-emitting element 3 can be dissipated with high efficiency.

When a blue-violet LED or ultraviolet LED is used as the light-emitting element 3, for example, the above-described fluorescent material may be used in combination with a blue fluorescent material that emits blue light or a blue-green fluorescent material that emits blue-green light. As the blue fluorescent material, it is possible to use, for example, an aluminate-based material such as $BaMgAl_{10}O_{17}:Eu^{2+}$, a silicate-based material such as $Ba_3MgSi_2O_8:Eu^{2+}$, a halophosphate-based material such as $(Sr, Br)_{10}(PO_4)_6Cl_2:Eu^{2+}$, and so on. As the blue-green fluorescent material, it is possible to use, for example, an aluminate-based material such as $Sr_4Al_{14}O_{25}:Eu^{2+}$, a silicate-based material such as $Sr_2Si_3O_8\text{-}2SrCl_2:Eu^{2+}$, and so on.

In the light-emitting device 1 of the present embodiment, it is preferable that a portion of the wavelength converting portion 6 that is located above the portion of the cover portion having a high refractive index (the second cover portion 38) has a refractive index higher than that of the other portion of the wavelength converting portion 39 (the border between the regions having different refractive indexes is indicated by dashed lines in FIG. 18). To control the refractive index of the wavelength converting portion 39 as described above, for example, the amount of metal oxide particles that are dispersed in a light-transmitting material (base material) may be adjusted in the manner described above. According to this preferred configuration, reflection at the interface between the cover portion (the first and second cover portions 37 and 38) and the wavelength converting portion 39 can be reduced, and thus a loss caused by the reflection can be reduced. Furthermore, in the wavelength converting portion 39, the intensity distribution can be made uniform.

The present embodiment has been described in the context of the base being a base 35 having a recess, but the present invention is not necessarily limited to the use of a base having this configuration, and it is also possible to use, for example, a flat plate-like base similar to those used in Embodiments 10 and 11 described later.

Furthermore, the present embodiment has been described in the context of the first and second cover portions 37 and 38 being covered tightly with the wavelength converting portion 39, but it is also possible to provide a space 40 between the first and second cover portions 37 and 38 and the wavelength converting portion 39 as shown in FIG. 20. According to this configuration, it is possible to suppress an increase in the temperature of the wavelength converting portion 39 caused by heat from the light-emitting element 36.

Furthermore, the present embodiment has been described in the context of a single light-emitting element 36 being disposed on the base 35, but the number of the light-emitting elements is not limited to a particular number, and it is possible to employ, for example, a configuration in which three light-emitting elements 36f, 36g and 36h are disposed on the base 35 as shown in FIG. 21. According to this configuration, the intensity of emitted light can be improved. It is also possible to employ, for example, a configuration as shown in FIG. 22, in which two light-emitting elements 36f and 36h are disposed on the base 35 and a cover portion having a high refractive index (second cover portion 38) is disposed between the light-emitting elements 36f and 36h. When the spacing between the light-emitting elements is relatively large, the distribution of primary light can be made uniform, and thus a thin surface light source can be realized. This effect is effective also when only primary light is used without using the wavelength converting portion. In this case, the light emitted from the light-emitting elements may be any of ultraviolet light, visible light and infrared light.

In order to simplify the description, the present embodiment has been described in the context of using two cover portions having different refractive indexes, but it is also possible to sequentially dispose three or more cover portions having different refractive indexes such that their refractive indexes are changed gradually.

Example

Hereinafter, examples of the present invention will be described. However, it should be noted that the present invention is not limited to the examples given below.

(Production of Light-Emitting Device)

As an example of the present invention, a light-emitting device shown in FIG. 23 was produced. As a comparative example, a light-emitting device in which a single type of resin was used for the cover portion was also produced (this light-emitting device had the same configuration as that of the light-emitting device shown in FIG. 23 except for the material of the cover portion).

As a light-emitting element 36, an LED chip (thickness: 0.2 mm, 1.0 mm square) that emits light having a wavelength of about 460 nm was used. As a base 35 having a recess, a substrate made of ceramic $Al_2O_3$ was used. The above LED chip was flip-chip mounted onto the bottom of the recess of the base 35 with Au bumps. The recess had a depth of 0.5 mm, and the upper opening of the recess had a diameter of 2 mm. As the material constituting a first cover portion 37, silicone resin having a refractive index of 1.5 with respective to light having a wavelength of 550 nm was used. As the material constituting a second cover portion 38, a composite material obtained by dispersing titanium oxide particles having an average particle size of 5 nm and a refractive index of 2.0 with respect to light having a wavelength of 550 nm in a silicone resin was used. The distance between the interface between the first cover portion 37 and the second cover portion 38 and the periphery of the light-emitting element 36 was about 0.2 mm. As the wavelength converting material for a wavelength converting portion 39, $Y_3Al_5O_{12}:Ce^{3+}$ was used, and as the light-transmitting material serving as a base material for the wavelength converting portion 39, a silicone resin was used. The wavelength converting portion 39 had a thickness of about 0.05 mm.

(Method for Measuring Color Temperature of Emitted Light)

In order to evaluate the color nonuniformity of light emitted from the produced light-emitting devices, the color temperature of the emitted light was measured. The measuring method will be described with reference to FIG. 7. In the state where the light-emitting device 34 is caused to emit light, the correlated color temperature of emitted light that passes through a semicircle having a radius of 1 m (indicated by the dashed line in FIG. 24) from the light-emitting device 34 serving as the center point was measured by using a detector 59 (S9219 available from Hamamatsu Photonics K.K., diameter of light-receiving surface: 11.3 mm). Then, radiation angles theta relative to the optical axis L of the light-emitting element 36 versus correlated color temperature differences relative to a correlated color temperature (about 6500 [K]) when theta=0 degrees were plotted. The obtained result is shown in FIG. 24. In FIG. 24, the result of the light-emitting device of the comparative example measured in the same manner as above is shown as well. It is preferable that the correlated color temperature difference of the emitted light within the radiation angle used is within 200 [K]. In the comparative example, the correlated color temperature difference within a radiation angle of plus or minus 70 [degrees] is about 230 [K], whereas in the present example, the correlated color temperature difference within a radiation angle of plus or minus 70 [degrees] is 120 [K] which is within the target value, namely, 200 [K].

As can be seen from FIG. 24, according to the light-emitting device 34 of the present example, the correlated color temperature difference is small, so that the color unevenness can be reduced.

Embodiment 9

A light-emitting device according to Embodiment 9 of the present invention will be described next with reference to FIG. 25. FIG. 25 is a cross-sectional view showing an example of the light-emitting device according to Embodiment 9 of the present invention.

As shown in FIG. 25, a light-emitting device 52 of the present embodiment includes a base 35 having a recess, and a single light-emitting element 36 that is disposed at the bottom of the recess (on the base 35). The light-emitting element 36 is covered with a first cover portion 37a in a tight contact state, and the upper outer periphery of the first cover portion 37a is replaced by a second cover portion 38a. Here, the first and second cover portions 37a and 38a are formed such that their upper surfaces are flush with each other. Furthermore, the first and second cover portions 37a and 38a are covered with a plate-like wavelength converting portion 39 in a tight contact state. The wavelength converting portion 39 has a uniform thickness, and a wavelength converting material constituting the wavelength converting portion 39 is distributed uniformly. The upper surface of the wavelength converting portion 39 is flush with the surface of the base 35 in which there is an opening of the recess.

The refractive index of the second cover portion 38a is set higher than the refractive index of the first cover portion 37a. In other words, in the light-emitting device 52 of the present embodiment, an upper portion (the second cover portion 38a), that is, at least a portion of the cover portion, in the outer periphery of the wavelength converting portion 39 has a refractive index higher than that of the other portion of the cover portion (the first cover portion 37a). By shortening the distance from the light-emitting element 36 to the interface between the first cover portion 37a and the second cover portion 38a, that is, by shortening the distance between the light-emitting element and the wavelength converting portion, the effect of the present invention to achieve a thin light-emitting device with less color nonuniformity can be attained. As the yardstick, it is sufficient to make the distance between the interface between the first cover portion 37a and the second cover portion 38a and the periphery of the light-emitting element smaller than the distance between the upper surface of the light-emitting element 36 and the undersurface of the wavelength converting portion 39. The distance between the interface between the first cover portion 37a and the second cover portion 38a and the periphery of the light-emitting element is 1 mm or less, preferably 0.5 mm or less, and more preferably 0.2 mm or less. As will be described later, the interface may be in contact with the light-emitting element.

The configuration of the light-emitting device 52 of the present embodiment also can provide effects similar to those obtained in the case of the light-emitting device 34 of Embodiment 8 described above.

Other configurations, such as the configuration and mounting method of the light-emitting element 36 and the material of each member, are the same as those of the light-emitting device 34 of Embodiment 8 described above.

Also in the light-emitting device 52 of the present embodiment, it is preferable that a portion of the wavelength converting portion 39 that is located above the portion of the cover portion having a high refractive index (the second cover portion 38a) has a refractive index higher than that of the other portion of the wavelength converting portion 39 (the border between the regions having different refractive indexes is indicated by dashed lines in FIG. 25).

Furthermore, as the base, a flat plate-like base similar to those used in Embodiments 10 and 11 described later can be used in the present embodiment.

The present embodiment also has been described in the context of the first and second cover portions 37a and 38a being covered tightly with the wavelength converting portion 39, but it is also possible to provide a space 40 between the first and second cover portions 37a and 38a and the wavelength converting portion 39 as shown in FIG. 26.

Furthermore, the present embodiment has been described in the context of a single light-emitting element 36 being disposed on the base 35, but the number of the light-emitting elements is not limited to a particular number, and it is possible to employ, for example, a configuration in which three light-emitting elements 36f, 36g and 36h are disposed on the base 35 as shown in FIG. 27. It is also possible to employ, for example, a configuration as shown in FIG. 28, in which two light-emitting elements 36f and 36h are disposed on the base 35, and a cover portion having a high refractive index (second cover portion 38a) is disposed between the light-emitting elements 36f and 36h. When the spacing between the light-emitting elements is relatively large, the distribution of primary light can be made uniform, and thus effects similar to those obtained in the example of Embodiment 8 described above (see FIG. 22) can be obtained such as realization of a thin surface light source.

Embodiment 10

A light-emitting device according to Embodiment 10 of the present invention will be described next with reference to FIG. 29. FIG. 29 is a schematic cross-sectional view showing an example of the light-emitting device according to Embodiment 10 of the present invention.

As shown in FIG. 29, a light-emitting device 53 of the present embodiment includes a flat plate-like base 35a, and a single light-emitting element 36 that is disposed on the base 35. The light-emitting element 36 is covered with a first cover portion 37b in a tight contact state, and the side face of the first cover portion 37b is surrounded by a second cover portion 38b in a tight contact state. Furthermore, the first and second cover portions 37b and 38b are covered with a wavelength converting portion 39a in a tight contact state. The wavelength converting portion 39a has a uniform thickness, and a wavelength converting material constituting the wavelength converting portion 39a is distributed uniformly.

The refractive index of the second cover portion 38b is set higher than the refractive index of the first cover portion 37b. In other words, in the light-emitting device 53 of the present embodiment, the cover portion (the second cover portion 38b) in the outer periphery of the wavelength converting portion 39a has a refractive index higher than that of the other portion of the cover portion (the first cover portion 37b).

The configuration of the light-emitting device 53 of the present embodiment also can provide effects similar to those obtained in the case of the light-emitting device 34 of Embodiment 8 described above.

In the light-emitting device 53 of the present embodiment, the wavelength converting portion 39a is formed into a dome shape, and the first and second cover portions 37b and 38b are formed into a hemisphere to fit into the dome shape of the wavelength converting portion 39a. According to this configuration, most of the light emitted from the light-emitting element 36 is incident upon the wavelength converting portion 39a perpendicularly to the wavelength converting portion 39a, and it is therefore possible to prevent the reflection of light at the interface between the wavelength converting portion 39a and the first and second cover portions 37b and 38b. Thereby, the light extraction efficiency can be further improved.

Other configurations, such as the configuration and mounting method of the light-emitting element 36, and the material of each member, are the same as those of the light-emitting device 34 of Embodiment 8 described above.

Also in the light-emitting device 53 of the present embodiment, it is preferable that a portion of the wavelength converting portion 39a that is located above the portion of the cover portion having a high refractive index (the second cover portion 38b) has a refractive index higher than that of the other portion of the wavelength converting portion 39a (the border between the regions having different refractive indexes is indicated by dashed lines in FIG. 29).

The present embodiment has been described in the context of the base being a flat plate-like base 35a, but the present embodiment is not necessarily limited to the use of a base having this configuration, and it is also possible to use, for example, a base having a recess similar to those used in Embodiments 8 and 9 described above.

The present embodiment also has been described in the context of the first and second cover portions 37b and 38b being covered with the wavelength converting portion 39a in a tight contact state, but it is also possible to provide a space 40a between the first and second cover portions 37b and 38b and the wavelength converting portion 39a as shown in FIG. 30.

Furthermore, the present embodiment has been described in the context of a single light-emitting element 36 being disposed on the base 35a, but the number of the light-emitting elements is not limited to a particular number, and it is possible to employ, for example, a configuration in which two light-emitting elements 36i and 36j are disposed on the base 35a as shown in FIG. 31.

Embodiment 11

A light-emitting device according to Embodiment 11 of the present invention will be described next with reference to FIG. 32. FIG. 32 is a schematic cross-sectional view showing an example of the light-emitting device according to Embodiment 11 of the present invention.

As shown in FIG. 32, a light-emitting device 54 of the present embodiment includes a flat plate-like base 35a, and a light-emitting element 36k that is disposed on the base 35a. The light-emitting element 36k is covered with a cover portion 41 in a tight contact state. Here, the cover portion 41 is formed by a first cover portion 37c that is disposed on the upper surface of the light-emitting element 36k, and a second cover portion 38c that surrounds tightly the side face of the light-emitting element 36k and the side face of the first cover portion 37c. Here, the first and second cover portions 37c and 38c are formed such that their upper surfaces are flush with each other. Furthermore, the first and second cover portions 37c and 38c are covered tightly with a wavelength converting portion 39b. In the present embodiment, at least a portion of the wavelength converting portion 39b that is located above the first and second cover portions 37c and 38c has a uniform thickness, and a wavelength converting material constituting the wavelength converting portion 6 is distributed uniformly.

The refractive index of the second cover portion 38c is set higher than the refractive index of the first cover portion 37c. In other words, in the light-emitting device 54 of the present embodiment, the cover portion (the second cover portion 38c) in the outer periphery of the wavelength converting portion 39b has a refractive index higher than that of the other portion of the cover portion (the first cover portion 37c).

The configuration of the light-emitting device 54 of the present embodiment also can provide effects similar to those obtained in the case of the light-emitting device 34 of Embodiment 8 described above.

Other configurations, such as the configuration and mounting method of the light-emitting element 36k, and the material of each member, are the same as those of the light-emitting device 34 of Embodiment 8 described above.

Similar to the case of Embodiment 10 given above, in the present embodiment also, the wavelength converting portion 39b may be formed into a dome shape (see FIG. 33).

Also in the light-emitting device 54 of the present embodiment, it is preferable that a portion of the wavelength converting portion 39b that is located above the portion of the cover portion having a high refractive index (the second cover portion 38c) has a refractive index higher than that of the other portion of the wavelength converting portion 39b (the border between the regions having different refractive indexes is indicated by dashed lines in FIG. 32).

Embodiment 12

A light-emitting device according to Embodiment 12 of the present invention will be described next with reference to FIG. 34. FIG. 34 is a plan view showing an example of the light-emitting device according to Embodiment 12 of the present invention.

As shown in FIG. 34, a light-emitting device 63 of the present embodiment includes a flat plate-like base 60, and a plurality of light-emitting elements 61 that are disposed on the base 60. The plurality of light-emitting elements 61 are covered with a continuous wavelength converting portion 62. The plurality of light-emitting elements 61 are disposed such that the spacing between adjacent light-emitting elements is decreased from the center portion side of the base 60 gradually toward the periphery side thereof.

With the configuration of the light-emitting device 63 of the present embodiment, it is also possible to provide a light-emitting device that can irradiate the irradiation surface with light of uniform color.

In the present embodiment, the plurality of light-emitting elements 61 are disposed such that the spacing between adjacent light-emitting elements is decreased from the center portion side of the base 60 gradually toward the periphery side thereof, but the present embodiment is not necessarily limited to this configuration. The plurality of light-emitting elements 61 may be disposed such that the mounting density of the light-emitting elements 61 per unit area of the wavelength converting portion 62 is increased from the center portion side of the base 60 gradually toward the periphery side thereof. Even with this configuration, it is possible to provide a light-emitting device that can irradiate the irradiation surface with light of uniform color. Furthermore, the plurality of light-emitting elements 61 may be disposed such that the light-emitting efficiency of the wavelength converting portion 62 is increased from the center portion side of the base 60 gradually toward the periphery side thereof. Even with this configuration, it is possible to provide a light-emitting device that can irradiate the irradiation surface with light of uniform color.

INDUSTRIAL APPLICABILITY

As described above, according to the present invention, it is possible to provide a light-emitting device that can irradiate the irradiation surface with light of uniform color by further reducing the light color difference across the light extraction surface of the wavelength converting portion that covers the light-emitting element. Accordingly, the present invention is useful as a light source for display backlighting, a light source for sensors, a light source for thin lighting devices, and so on, that are required to be compact and thin. Furthermore, there is no particular limitation on the shape of the emitting surface. Besides a quadrangle which is commonly used, any shape can be used such as a polygonal shape, circular shape, elliptic shape or star-like shape.

The invention claimed is:

1. A light-emitting device comprising a base, and a light-emitting element that is disposed on the base and that emits primary light,
    wherein the light-emitting element comprises a plurality of semiconductor layers including a light emitting layer, and
    the light-emitting element is covered with a wavelength converting portion that includes a wavelength converting material that absorbs part of the primary light and emits secondary light, and
    wherein a plurality of the light-emitting elements are provided, and
    the plurality of light-emitting elements are covered with the wavelength converting portion that is continuous, and are disposed such that a spacing between adjacent light-emitting elements is decreased from a center portion side of the base gradually toward a periphery side thereof,
    wherein the plurality of light-emitting elements are disposed such that a light-emitting efficiency of the wavelength converting portion is increased from a center portion side of the base gradually toward a periphery side thereof.

2. The light-emitting device according to claim 1, wherein the plurality of the light-emitting elements are disposed such that a mounting density of the light-emitting elements per unit area of the wavelength converting portion is increased from a center portion side of the base gradually toward a periphery side thereof.

* * * * *